United States Patent [19]
Ashida et al.

[11] Patent Number: 6,150,685
[45] Date of Patent: Nov. 21, 2000

[54] SEMICONDUCTOR DEVICE WITH FILED-EFFECT TRANSISTORS OF A COMPLEMENTARY TYPE AND METHOD OF MANUFACTURING THE SAME

[75] Inventors: Motoi Ashida; Masayuki Yamashita; Kiyoyasu Akai, all of Hyogo, Japan

[73] Assignee: Mitsubishi Denki Kabushiki Kaisha, Tokyo, Japan

[21] Appl. No.: 09/073,430

[22] Filed: May 6, 1998

[30] Foreign Application Priority Data

Nov. 13, 1997 [JP] Japan ................................ 9-311946

[51] Int. Cl.[7] ............................. H01L 29/78; H01L 33/00
[52] U.S. Cl. ........................................... 257/296; 257/369
[58] Field of Search .................................... 257/296, 369, 257/903

[56] References Cited

U.S. PATENT DOCUMENTS 5,686,736  11/1997  Natsume .
5,686,752  11/1997  Ishimura et al. .
5,798,551   8/1998  Kikushima et al. .
5,830,788  11/1998  Hiroki et al. .
5,841,153  11/1998  Kariyama et al. .

FOREIGN PATENT DOCUMENTS 3-196565  8/1991  Japan .

Primary Examiner—Stephen D. Meier
Attorney, Agent, or Firm—McDermott, Will & Emery

[57] ABSTRACT

A semiconductor device prevents latch up and enables subminiaturization of its structure, and a method can manufacture the semiconductor device. In the semiconductor device containing field-effect transistors of a complementary type, an interconnection containing semiconductor having n-type impurity connects a p-type impurity diffusion region forming an emitter electrode of a parasitically formed bipolar transistor to an n-type impurity diffusion region electrically connected to a power supply line. Thereby, a pn junction operating as a rectifier element is formed at a contact region between a connection portion and the p-type impurity diffusion region.

13 Claims, 26 Drawing Sheets

SEMICONDUCTOR DEVICE WITH FILED-EFFECT TRANSISTORS OF A COMPLEMENTARY TYPE AND METHOD OF MANUFACTURING THE SAME

BACKGROUND OF THE INVENTION

1. Field of the Invention

The present invention relates to a semiconductor device and a method of manufacturing the same, and particularly relates to a semiconductor device provided with field-effect transistors of a complementary type and a method of manufacturing the same.

2. Description of the Background Art

A static semiconductor memory device, which will be referred to as a "Static Random Access Memory (SRAM)" hereinafter, has been known as a kind of semiconductor device. A memory cell in the SRAM is generally formed of a flip-flop circuit and transistors for reading and writing data. The SRAM is a semiconductor memory device which holds data in accordance with an operation situation of the flip-flop circuit. Such an SRAM has been known that uses field-effect transistors as load elements in the flip-flop circuit forming the memory cell.

FIG. 29 is an equivalent circuit diagram of a memory cell in an SRAM using field-effect transistors as load elements in the prior art. Referring to FIG. 29, the memory cell in the SRAM which uses field-effect transistors as load elements includes six transistors, i.e., access transistors A1 and A2, driver transistors D1 and D2, and load transistors T1 and T2. Driver transistors D1 and D2 and load transistors T1 and T2 form flip-flop circuits. Access transistors A1 and A2 are transistors for reading and writing data. Access transistors A1 and A2 and driver transistors D1 and D2 are n-type field-effect transistors. Load transistors T1 and T2 are p-type field-effect transistors. Therefore, driver transistors D1 and D2 and load transistors T1 and T2 form field-effect transistors of a complementary type. Access transistors A1 and A2 each have source/drain regions, one of which is connected to a bit line 117 or a complementary bit line 118. Gate electrodes of access transistors A1 and A2 are connected to a word line 113. Source regions of load transistors T1 and T2 are connected to a power supply line 114. Source regions of driver transistors D1 and D2 are connected to a ground line (not shown).

FIG. 30 is a layout plan showing a memory cell pattern of the SRAM using the field-effect transistors as the load transistors in the prior art. FIG. 31 is a cross section showing a structure taken along line 100—100 in FIG. 30.

Referring to FIGS. 30 and 31, description will now be given on the SRAM using the field-effect transistors as the load transistors in the prior art.

Referring to FIG. 30, the memory cell in the conventional SRAM which uses the field-effect transistors as the load transistors includes access transistors A1 and A2, driver transistors D1 and D2, load transistors T1 and T2, power supply line 114, ground lines 115 and 116, bit line 117, complementary bit line 118 and word line 113 also serving as gate electrodes of access transistors A1 and A2. Access transistor A1 includes gate electrode 113 and source/drain regions 111c and 111b. Access transistor A2 includes gate electrode 113 and source/drain regions 112c and 112b. Driver transistor D1 includes a gate electrode 107, a source regions 111a and a drain region 111b. Driver transistor D2 includes a gate electrode 108, a source region 112a and a drain region 112b. Load transistor T1 includes gate electrode 107, a source region 105a and a drain region 105b. Load transistor T2 includes gate electrode 108, a source region 106a and a drain region 106b. Source/drain regions 111a–111c and 112a–112c of access transistors A1 and A2 and driver transistors D1 and D2 are formed by implanting n-type impurity into a main surface of a semiconductor substrate. Source/drain regions 105a, 105b, 106a and 106b of load transistors T1 and T2 are formed by implanting p-type impurity into the main surface of the semiconductor substrate. Diffusion regions 103 and 104 of n-type impurity are formed at the main surface of the semiconductor substrate.

Gate electrodes 113, 107 and 108 of transistors A1, A2, D1, D2, T1 and T2 are formed of polycrystalline silicon films formed on the semiconductor substrate. Interconnections made of aluminum, i.e., internal interconnections 109 and 110, ground lines 115 and 116, power supply interconnections 140 and 141, and power supply line 114 are form at regions above these transistors with a first interlayer insulating film 142 (see FIG. 31) therebetween, respectively. Internal interconnection 109 is connected to drain region 105b of load transistor T1, gate electrodes 108 of load transistor T2 and driver transistor D2, and region 111b, i.e., one of the source/drain regions of access transistor A1 which also serves as the drain region of driver transistor D1, through contact holes 125, 127 and 129, respectively. Likewise, internal interconnection 110 is connected to drain region 106b of load transistor T2, gate electrodes 107 of load transistor T1 and driver transistor D1, and region 112b, i.e., one of the source/drain regions of access transistor A2 which also serves as the drain region of driver transistor D2, through contact holes 126, 128 and 130, respectively. Ground lines 115 and 116 are connected to source regions 111a and 112a of driver transistors D1 and D2 through contact holes 131 and 132, respectively. Power supply line 114 is in contact with n-type impurity diffusion regions 101 and 102 through contact holes 119 and 120, respectively. Power supply interconnection 140 is in contact with n-type impurity diffusion region 103 and source region 105a of load transistor T1 through contact holes 121 and 122, respectively. Power supply interconnection 141 is in contact with n-type impurity diffusion region 104 and source region 106a of load transistor T2 through contact holes 123 and 124, respectively.

A second interlayer insulating film 143 (FIG. 31) is formed over first interlayer insulating film 142, internal interconnections 109 and 110, ground lines 115 and 116, power supply interconnections 140 and 141, and power supply line 114. Bit line 117 and complementary bit line 118 are formed on second interlayer insulating film 143. The other source/drain region 111c and 112c of access transistors A1 and A2 are connected to bit line 117 and complementary bit line 118 through contact holes 133 and 134, respectively.

Referring to FIG. 31, n- and p-type wells 138 and 139 are formed at the main surface of semiconductor substrate 137. n-type impurity diffusion regions 101 and 103 and p-type impurity diffusion region 105a, i.e., a source region of load transistor T1 (FIG. 30) are formed at the main surface of n-type well 138. n-type diffusion region 111a, i.e., the source region of driver transistor D1 (FIG. 30) is formed at the main surface of p-type well 139. An isolating oxide film 135 is formed at the main surface of semiconductor substrate 137 between source region 105a of load transistor T1 and source region 111a of driver transistor D1. Interlayer insulating film 142 is formed over the main surface of semiconductor substrate 137 and isolating oxide film 135. Contact holes 119, 121, 122 and 131 are formed at regions above n-type impurity diffusion regions 101 and 103, source region 105a of load transistor T1 and source region 111a of driver transistor D1 by removing interlayer insulating film 142 from these regions. Power supply line 114 which is in contact with n-type impurity diffusion region 101 is formed in contact hole 119 and on interlayer insulating film 142. Power supply interconnection 140 made of aluminum is formed in contact holes 121 and 122 and on interlayer insulating film 142, and is in contact with n-type impurity diffusion region 103 and source region 105a of load transistor T1. Ground line 115 which is in contact with source region 111a of driver transistor D1 is formed in contact hole 131 and on interlayer insulating film 142.

In the memory cell of conventional SRAM, two bipolar transistors are parasitically formed as shown in FIG. 32. More specifically, there are formed a pnp bipolar transistor Q1 which includes an emitter electrode formed of source region 105a of load transistor T1, a base electrode formed of n-type well 138 and a collector electrode formed of p-type well 139 as well as a npn bipolar transistor Q2 which includes a collector electrode formed of n-type well 138, a base electrode formed of p-type well 139 and an emitter electrode formed of source region 111a of driver transistor D1. These parasitically formed bipolar transistors Q1 and Q2 parasitically form a thyristor. FIG. 32 is an equivalent circuit diagram of the thyristor which is parasitically formed in the conventional SRAM. Since the thyristor is parasitically formed, this thyristor may operate due to noises on the power supply voltage supplied to power supply line 114 (FIG. 31). When the parasitically formed thyristor operates, a current continuously flows from power supply line 114 to ground line 115 (FIG. 31). This phenomenon is called latch up. The latch up may impede the operation of the semiconductor element, and further may break the semiconductor element dues to heat generation by a large current.

As measures for the latch up in the prior art, n-type well 138 in FIG. 31 is used as a part of a path for supplying a power from power supply line 114 to source region 105a of load transistor T1. More specifically, a power supply current which is supplied to the power supply line 114 is transmitted from n-type impurity diffusion region 101 to n-type impurity diffusion region 103 through n-type well 138. Since the power supply current is transmitted from n-type impurity diffusion region 103 to source region 105a of load transistor T1 through power supply interconnection 140. Therefore, a substrate resistance of n-type well 138 can lower the power supply voltage supplied to source region 105a of load transistor T1, which is the emitter electrode of parasitically formed bipolar transistor Q1 (FIG. 32). As a result, the power supply current is supplied to the emitter electrode, i.e., source region 105a of load transistor T1 and n-type well 138, i.e., a base electrode of bipolar transistor Q1. Therefore, it is possible to prevent occurrence of forward bias between the emitter and base electrodes of bipolar transistor Q1. In this manner, the latch up is prevented in the prior art.

Demands for subminiaturization and increase in integration density of semiconductor devices are now increasing. In the conventional SRAM shown in FIG. 31, a space of at least about 5 μm is kept between source region 105a of load transistor T1 and source region 111a of driver transistor D1, and isolating oxide film 135 has a length L of about 5 μm. In view of the foregoing demands, it is now requested in some cases to reduce these space and length to a higher extent for subminiaturizing the memory cells. However, if the distance between the source region 105a of load transistor T1 and source region 111a of driver transistor D1 were further reduced below 5 μm, the performance of parasitically formed bipolar transistors Q1 and Q2 would consequently be improved so that the latch up would be cause even by noises on the power supply voltage which are smaller than those in the prior art. Accordingly, it is difficult to achieve the subminiaturization of semiconductor elements and the increase in integration density only by the conventional measures utilizing a substrate resistance of n-type well 138, while preventing the latch up.

SUMMARY OF THE INVENTION

An object of the invention is to provide a semiconductor device of which structure can be subminiaturized while preventing latch up.

Another object of the invention is to provide a method of manufacturing a semiconductor device of which structure can be subminiaturized while preventing latch up.

In a semiconductor device according to an aspect of the invention, a semiconductor substrate is provided at its main surface with a first semiconductor region of a first conductivity type and a second semiconductor region of a second conductivity type neighboring to each other. The first semiconductor region is provided at its main surface with a first impurity region of the first conductivity type electrically connected to a power supply line or a ground line. The first semiconductor region is provided at its main surface with a second impurity region of the second conductivity type. The second semiconductor region is provided at its main surface with a third impurity region of the first conductivity type electrically connected to the power supply line or the ground line. A connection portion containing semiconductor is in contact with the first and second impurity regions. First and second bipolar transistors are parasitically formed at the main surface of the semiconductor substrate. The first bipolar transistor includes a first emitter electrode formed of the second impurity region, a first base electrode formed of the first semiconductor region, and a first collector electrode formed of the second semiconductor region. The second bipolar transistor includes a second collector electrode formed of the first semiconductor region, a second base electrode formed of the second semiconductor region, and a second emitter electrode formed of the third impurity region. The first and second bipolar transistors parasitically form a thyristor.

As described above, the connection portion including the semiconductor is in contact with the first and second impurity regions so that a rectifier element can be formed at a connection region between the connection portion and at least one of the first and second impurity regions. Thereby, a power supply current can be supplied to the first emitter electrode of the parasitically formed first bipolar transistor through the rectifier element. Also, the power supply current can be supplied to the first base electrode of the first bipolar transistor from the first impurity region without passing through the rectifier element. In the first bipolar transistor, therefore, the power supply voltage supplied to the first emitter electrode can always be lower than the power supply voltage applied to the first base electrode. It is therefore possible to prevent the forward bias between the first emitter electrode and the first base electrode in the first bipolar transistor. Consequently, operation of the thyristor which is parasitically formed can be prevented. Accordingly, the latch up can be prevented even when a distance between the second and third impurity regions is reduced for subminiaturizing the semiconductor elements. Thus, the semiconductor device can be subminiaturized while preventing the latch up.

In the semiconductor device according to the above aspect, the distance between the second and third impurity regions may be 2.0 μm or less. In this structure, the distance between the second and third impurity regions is significantly reduced compared with a conventional structure utilizing a substrate resistance for preventing latch up, so that the structure of the semiconductor device can be subminiaturized to a higher extent than the prior art, while suppressing the latch up.

In the semiconductor device according to the above aspect, an isolating oxide film having a width of 2 μm or less is formed at the main surface of the semiconductor substrate between the second and third impurity regions. Therefore, the second and third impurity regions can be formed in a self-aligned manner in a step of manufacturing the semiconductor device. Since the isolating oxide film has the width of 2.0 μm or less, the distance between the second and third isolating oxide film can be significantly reduced compared with the conventional structure utilizing the substrate resistance for preventing latch up. Consequently, the structure of the semiconductor device can be subminiaturized to a higher extent than the prior art, while preventing latch up.

In the semiconductor device according to the above aspect, the connection portion may contain silicide of refractory metal. Thereby, other interconnections can be formed simultaneously with the connection portion. Consequently, formation of the connection portion does not significantly increase the number of steps for forming the semiconductor device compared with the that in the prior art.

In the semiconductor device according to the above aspect, the semiconductor device may be a static semiconductor memory device using a field-effect transistor as a load element. The static semiconductor memory device using the field-effect transistor as the load element requires six field-effect transistors arranged at the main surface of the semiconductor substrate. Since this number of field-effect transistors is much larger than that of field-effect transistors in a memory cell of another type of semiconductor memory device, the memory cell of the static semiconductor memory device has a larger size than that of another type of semiconductor memory device. In the static semiconductor memory device, however, the rectifier element is formed by forming the connection portion, and thereby the distance between the second and third impurity regions can be reduced while preventing latch up. Accordingly, in the static semiconductor memory device provided with the memory cells, each including the field-effect transistors larger in number than another type of semiconductor memory device, the invention can achieve a remarkable effect by subminiaturizing the memory cells.

In the semiconductor device according to the above aspect, the connection portion is utilized as a part of an interconnection. Therefore, the semiconductor device can have a simpler structure than that having an independent connection portion. As a result, the semiconductor device can be subminiaturized further effectively, and the manufacturing steps thereof can be simplified.

In the semiconductor device according to the above aspect, the connection portion may be utilized as a part of the power supply line. Thereby, the semiconductor device can have a simpler structure than that having a connection portion formed independently of the power supply line. As a result, the semiconductor device can be subminiaturized further effectively, and the manufacturing steps thereof can be simplified.

In the semiconductor device according to the above aspect, the internal interconnection is made of the substantially same material as the connection portion. Therefore, the connection portion and the internal interconnection of the semiconductor device can be formed in the same step. Consequently, the semiconductor device can be subminiaturized and the manufacturing steps can be simplified while preventing latch up.

The semiconductor device according to the above aspect may further include an interlayer insulating film provided with a contact hole, a plurality of conductor portions partially exposed in the contact hole, and an interconnection made of the substantially same material as the connection portion. The interconnection may have a portion located in the contact hole and electrically connected to the plurality of conductor portions. According to this structure, the contact holes can be reduced in number compared with the structure in which independent contact holes are formed for the plurality of conductor portions, respectively, and the interconnection is connected to the plurality of conductor portions through different contact holes, respectively. Consequently, the semiconductor device can be further miniaturized.

According to another aspect of the invention, a semiconductor device is provided with field-effect transistors of a complementary type. First and second bipolar transistors are parasitically formed. The first and second bipolar transistors parasitically form a thyristor. A rectifier element is electrically connected to an emitter electrode of the first bipolar transistor and a power supply portion. The first bipolar transistor has a base electrode electrically connected to the power supply portion. According to this structure, the emitter electrode of the first bipolar transistor is supplied with the power supply current through the rectifier element. The base electrode is supplied with the power supply current without passing through the rectifier element. Therefore, the power supply voltage applied to the emitter electrode can always be lower than the power supply voltage supplied to the base electrode. Therefore, forward bias between the emitter electrode and the base electrode of the first bipolar transistor can be prevented even if distances between the plurality of field-effect transistors forming the field-effect transistor of the complementary type are reduced for subminiaturizing the semiconductor device. Consequently, operation of the parasitically formed thyristor can be prevented. Accordingly, the semiconductor device can be subminiaturized while preventing latch up.

In the semiconductor device according to the above aspect, a reverse resistance R1 of the rectifier and an ON resistance R2 of a p-type field-effect transistor forming the field-effect transistor of the complementary type may satisfy a relationship of R2/100<R1<100×R2. Thereby, stable operation of the field-effect transistors of the complementary type can be achieved while preventing latch up. If R1 were smaller than R2/100, it would be impossible to lower sufficiently the power supply voltage applied to the emitter electrode, and therefore it would be difficult to prevent reliably the forward bias between the emitter electrode and the base electrode. If R1 is larger than 100×R2, it would be difficult to supply a sufficient power supply current to the field-effect transistors of the complementary type, and therefore stable operation of the field-effect transistors of the complementary type would be difficult.

In the semiconductor device according to the above aspect, the semiconductor device may be a static semiconductor memory device using a field-effect transistor as a load element. The static semiconductor memory device using the field-effect transistor as the load element requires six field-effect transistors arranged at the main surface of the semiconductor substrate. Since this number of field-effect transistors is much larger than that of field-effect transistors in a memory cell of another type of semiconductor memory device, the memory cell of the static semiconductor memory device has a larger size than that of another type of semiconductor memory device. In the static semiconductor memory device, however, latch up can be prevented owing to formation of the rectifier element, and thereby the distance between the field-effect transistors forming the memory cell can be shorter than that in the prior art. Therefore, in the static semiconductor memory device provided with the memory cells, each including the field-effect transistors larger in number than those in another type of semiconductor memory device, the invention can achieve a remarkable effect by subminiaturizing the memory cells.

In the semiconductor device according to the above aspect, the semiconductor device may be a static semiconductor memory device using a field-effect transistor as a load element. The static semiconductor memory device may include a plurality of memory cells each including at least one rectifier element. According to this structure, even if the field-effect transistors of the plurality of memory cells have different electric characteristics, respectively, the reverse resistance of the rectifier element in each memory cell can be adjusted in accordance with the electric characteristics of the field-effect transistor in the same memory cell independently of the other memory cells. Therefore, latch up can be prevented more reliably.

In the semiconductor device according to the above aspect, the semiconductor device may be a static semiconductor memory device using a field-effect transistor as a load element. The rectifier element of one in number is provided for the two or more memory cells in the static semiconductor memory device. Therefore, the number of the rectifier elements can be reduced compared with the case where each memory cell is provided with a rectifier element dedicated thereto, so that the semiconductor device can have a simple structure. Consequently, the semiconductor device can be further subminiaturized.

In a method of manufacturing a semiconductor device according to still another aspect of the invention, impurity of a first conductivity type is implanted into a main surface of a semiconductor substrate to form a first semiconductor region of the first conductivity type. Impurity of a second conductivity type is implanted into the main surface of the semiconductor substrate to form a second semiconductor region of the second conductivity type. Impurity of the first conductivity type is implanted into the main surface of the first semiconductor region to form a first impurity region of the first conductivity type. Impurity of the second conductivity type is implanted into the main surface of the first semiconductor region to form a second impurity region of the second conductivity type. Impurity of the first conductivity type is implanted into the main surface of the second semiconductor region to form a third impurity region of the first conductivity type. An interlayer insulating film is formed on the first, second and third impurity regions. First and second openings are formed at regions of the interlayer insulating film located above the first and second impurity regions, respectively. A semiconductor film is formed in the first and second openings and on the interlayer insulating film. At least one of impurity of the first conductivity type and impurity of the second conductivity type is implanted into the semiconductor film. A portion of the semiconductor film is removed to form a connection portion in contact with the first and second impurity regions. A power supply line electrically connected to the first impurity region is formed.

A ground line electrically connected to the third impurity region is formed. Thereby, first and second bipolar transistors are parasitically formed. The first bipolar transistor is formed of a first emitter electrode formed of the second impurity region, a first base electrode formed of the first semiconductor region, and a first collector electrode formed of the second semiconductor region. The second bipolar transistor is formed of a second collector electrode formed of the first semiconductor region, a second base electrode formed of the second semiconductor region, and a second emitter electrode formed of the third impurity region. The first and second bipolar transistors parasitically form a thyristor. As described above, the connection portion, which is formed of the semiconductor film having at least one of the impurity of the first conductivity type and the impurity of the second conductivity type, is in contact with the first and second impurity regions. Therefore, a rectifier element can be formed at one of the connection regions where the first and second impurity regions are in contact with the connection portion. Thereby, a power supply current can be supplied through the rectifier element to the first emitter electrode of the first bipolar transistor which is parasitically formed. Also, the power supply current can be supplied from the first impurity region to the first base electrode of the first bipolar transistor without passing through the rectifier element. In the first bipolar transistor, therefore, the power supply voltage applied to the first emitter electrode can always be lower than the power supply voltage applied to the first base electrode. Thereby, it is possible to prevent occurrence of forward bias between the first emitter electrode and the first base electrode of the first bipolar transistor. Consequently, operation of the parasitically formed thyristor is prevented even if a distance between the second and third impurity regions is reduced for subminiaturizing the semiconductor device. Accordingly, the semiconductor device can be subminiaturized while preventing latch up.

In the method of manufacturing the semiconductor device of the above aspect, the step of implanting at least one of the impurity of the first conductivity type and the impurity of the second conductivity type into the semiconductor film may be the step of ion-implanting impurity into the semiconductor film. In this case, a reverse resistance of the rectifier element can be controlled by controlling an implantation dose of ions into the semiconductor film in the step of ion implantation. Consequently, latch up can be reliably prevented by controlling the reverse resistance of the rectifier element in accordance with the electric characteristics of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described below with reference to the drawings.

Embodiment 1

Figure 1:
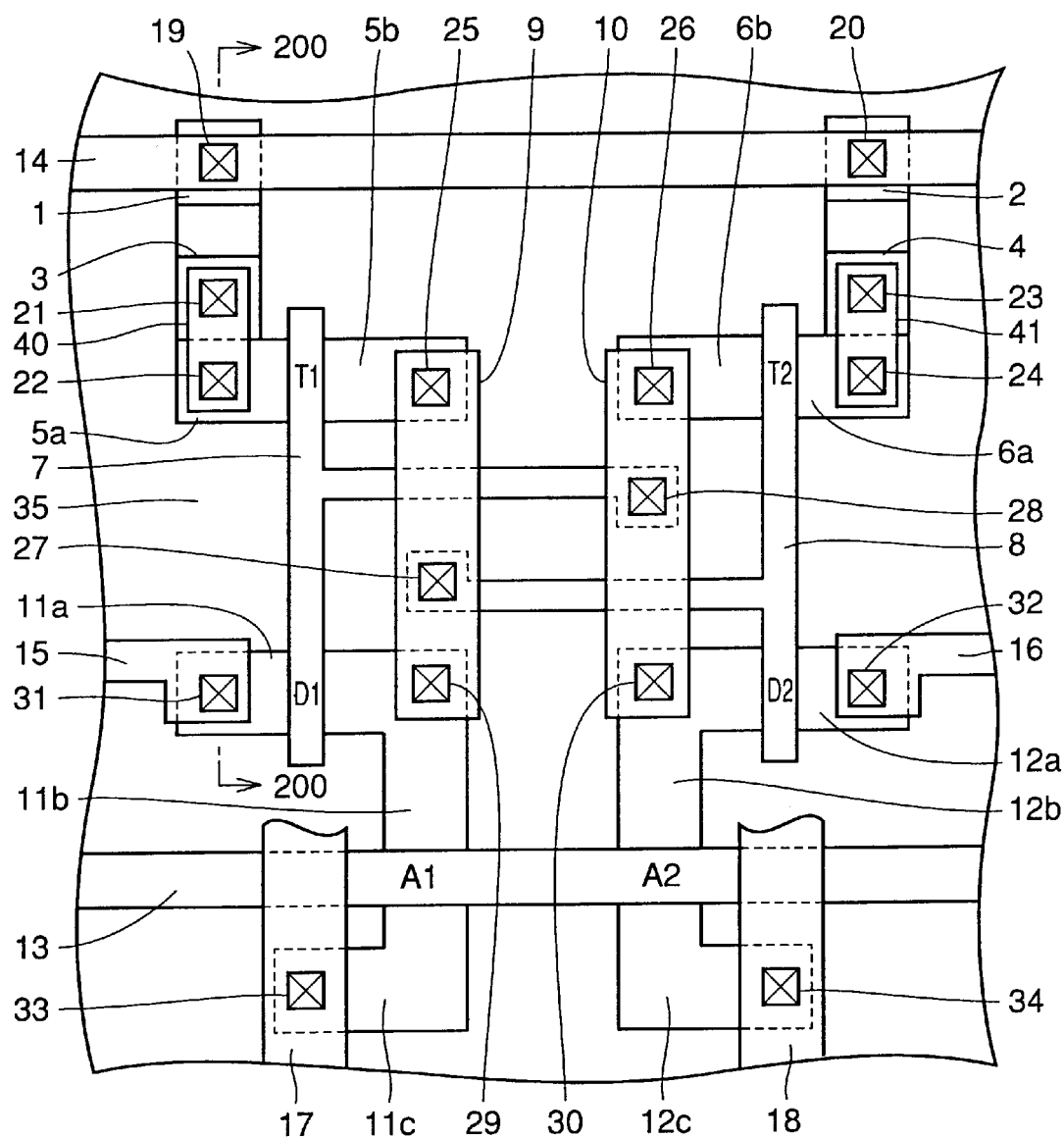
FIG. 1 is a layout plan of an SRAM according to an embodiment 1 of the invention.
Figure 2:
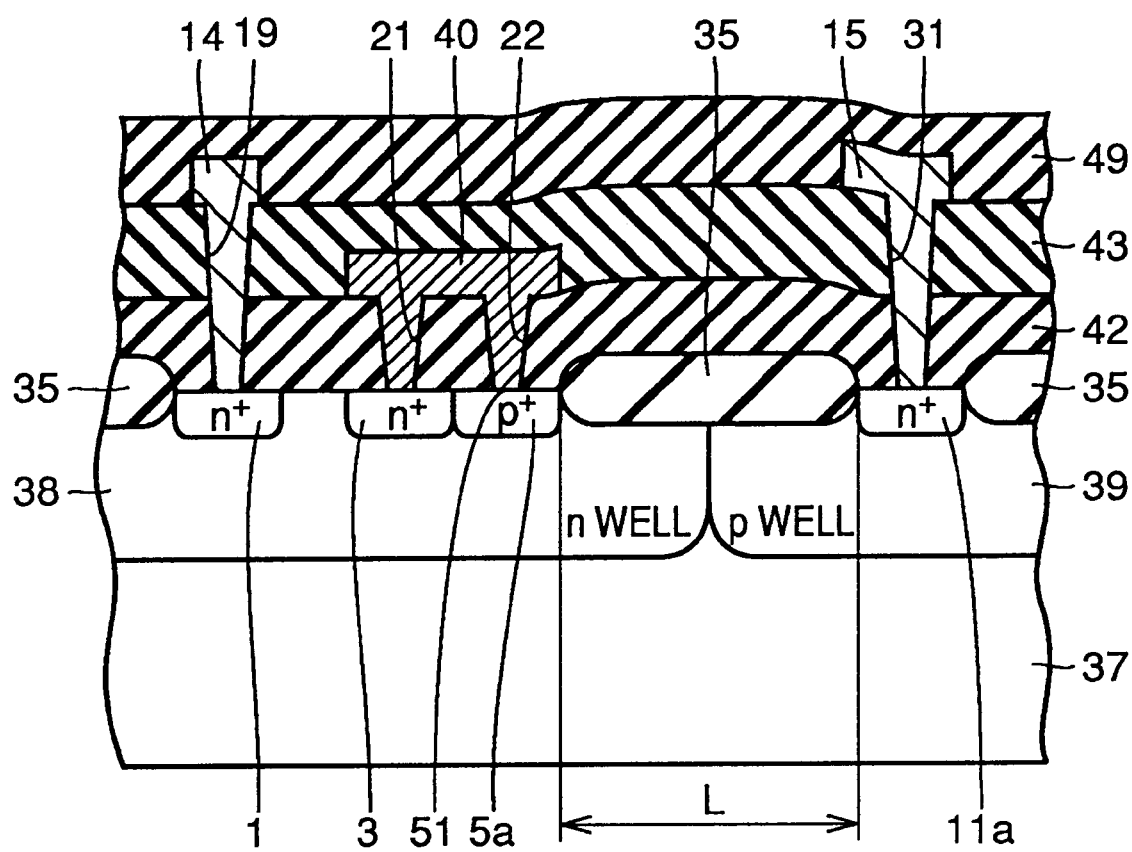
FIG. 2 is a cross section taken along line 200—200 in FIG. 1 and showing a structure of the SRAM according to the embodiment 1 of the invention.

Referring to FIGS. 1 and 2, an SRAM of an embodiment 1 of the invention will be described below.

Referring to FIG. 1, a memory cell of the SRAM according to the embodiment 1 of the invention includes access transistors A1 and A2, driver transistors D1 and D2, load transistors T1 and T2, a power supply line 14, ground lines 15 and 16, a bit line 17, a complementary bit line 18 and a word line 13 which also serves as gate electrodes of access transistors A1 and A2. Access transistor A1 includes gate electrode 13 and source/drain regions 11c and 11b. Access transistor A2 includes gate electrode 13 and source/drain regions 12c and 12b. Driver transistor D1 includes a gate electrode 7, a source region 11a and drain region 11b. Driver transistor D2 includes a gate electrode 8, a source region 12a and drain region 12b. Load transistor T1 includes gate electrode 7, a source region 5a and a drain region 5b. Load transistor T2 includes gate electrode 8, a source region 6a and a drain region 6b. Source/drain regions 11a–11c and 12a–12c of access transistors A1 and A2 and driver transistors D1 and D2 are formed by implanting n-type impurity into the main surface of a semiconductor substrate 37 (FIG. 2). Source/drain regions 5a, 5b, 6a and 6b of load transistors T1 and T2 are formed by implanting p-type impurity into the main surface of semiconductor substrate 37. Gate electrodes 13, 7 and 8 of these transistors A1, A2, D1, D2, T1 and T2 are formed of polycrystalline silicon films formed on the main surface of semiconductor substrate 37 with a gate insulating film (not shown) therebetween. Power supply interconnections, i.e., interconnections 40 and 41 for power supply made of tungsten silicide are formed at regions above these transistors with a first interlayer insulating film 42 (FIG. 2) therebetween. Power supply interconnection 40 is in contact with an n-type impurity diffusion region 3 and source region 5a of load transistor T1 through contact holes 21 and 22, respectively. Power supply interconnection 41 is in contact with an n-type impurity diffusion region 4 and source region 6a of load transistor T2 through contact holes 23 and 24, respectively. Power supply interconnections 40 and 41 are doped with phosphorus, i.e., n-type impurity implanted thereinto in a manufacturing step, which will be described later, at a dose of $1.0 \times 10^{20}$ PCs/cm$^2$ with an implantation energy of 20 keV.

A second interlayer insulating film 43 (FIG. 2) is formed over first interlayer insulating film 42 and power supply interconnections 40 and 41. Internal interconnections 9 and 10, ground lines 15 and 16, and a power supply line 14 are formed on second interlayer insulating film 43. Internal interconnection 9 is electrically connected to drain region 5b of load transistor T1, gate electrodes 8 of load transistor T2 and driver transistor D2, and region 11b serving as the drain region of driver transistor D1 and also serving as one of the source/drain regions of access transistor A1 through contact holes 25, 27 and 29, respectively. Likewise, internal interconnection 10 is electrically connected to drain region 6b of load transistor T2, gate electrodes 7 of load transistor T1 and driver transistor D1, and region 12b serving as the drain region of driver transistor D2 and also serving as one of the source/drain regions of access transistor A2 through contact holes 26, 28 and 30, respectively. Source regions 11a and 12a of driver transistors D1 and D2 are connected to ground lines 15 and 16 through contact holes 31 and 32, respectively. Power supply line 14 is in contact with n-type impurity diffusion regions 1 and 2, which are formed at the main surface of semiconductor substrate 37, through contact holes 19 and 20, respectively. Semiconductor substrate 37 is also provide at its main surface with n-type impurity diffusion regions 3 and 4.

A third interlayer insulating film 49 (FIG. 2) is formed over second interlayer insulating film 43, internal interconnections 9 and 10, ground lines 15 and 16, and power supply line 14. Bit line 17 and complementary bit line 18 are formed on third interlayer insulating film 49. The other source/drain regions 11c and 12c of access transistors A1 and A2 are connected to bit line 17 and complementary bit line 18 through contact holes 33 and 34, respectively.

Referring to FIG. 2, an n-type well 38 and a p-type well 39 are formed at the main surface of semiconductor substrate 37. An isolating oxide film 35 is formed at a predetermined region on the main surface of the semiconductor substrate 37. Isolating oxide film 35 has a width L of about 2.0 μm. n-type impurity diffusion regions 1 and 3 as well as p-type impurity diffusion region 5a which is the source region of load transistor T1 (FIG. 1) are formed at the main surface of n-type well 38. The source region of driver transistor D1 (FIG. 1), i.e., n-type impurity diffusion region 11a is formed at the main surface of p-type well 39. First interlayer insulating film 42 is formed over the main surface of semiconductor substrate 37 and interlayer oxide film 35. Interlayer insulating film 42 is removed from regions above n-type impurity diffusion region 3 and source region 5a of load transistor T1 so that contact holes 21 and 22 are formed. Power supply interconnection 40 made of tungsten silicide is formed in contact holes 21 and 22 and on interlayer insulating film 42, and is in contact with n-type impurity diffusion region 3 and source region 5a of load transistor T1.

Second interlayer insulating film 43 is formed over power supply interconnection 40 and interlayer insulating film 42. First and second interlayer insulating films 42 and 43 are removed from regions above n-type impurity diffusion region 1 and source region 11a of driver transistor D1, whereby contact holes 19 and 31 are formed. Power supply line 14 made of aluminum is formed in contact hole 19 and on second interlayer insulating film 43, and is in contact with n-type impurity diffusion region 1. Ground line 15 made of aluminum is formed in contact hole 31 and on second interlayer insulating film 43, and is in contact with source region 11a of driver transistor D1. Third interlayer insulating film 49 is formed over second interlayer insulating film 43, power supply line 14 and ground line 15.

The power supply current supplied to power supply line 14 flows from n-type impurity diffusion region 1 through n-type well 38, n-type impurity diffusion region 3 and power supply interconnection 40 to source region 5a of load transistor T1. A pn junction operating as a rectifier element is formed at a contact region 51 where power supply interconnection 40 doped with n-type impurity, i.e., phosphorus is in contact with p-type impurity region, i.e., source region 5a of load transistor T1. A pn junction serving as a rectifier element is likewise formed at a contact region where power supply interconnection 41 is in contact with source region 6a of load transistor T2.

Figure 3:
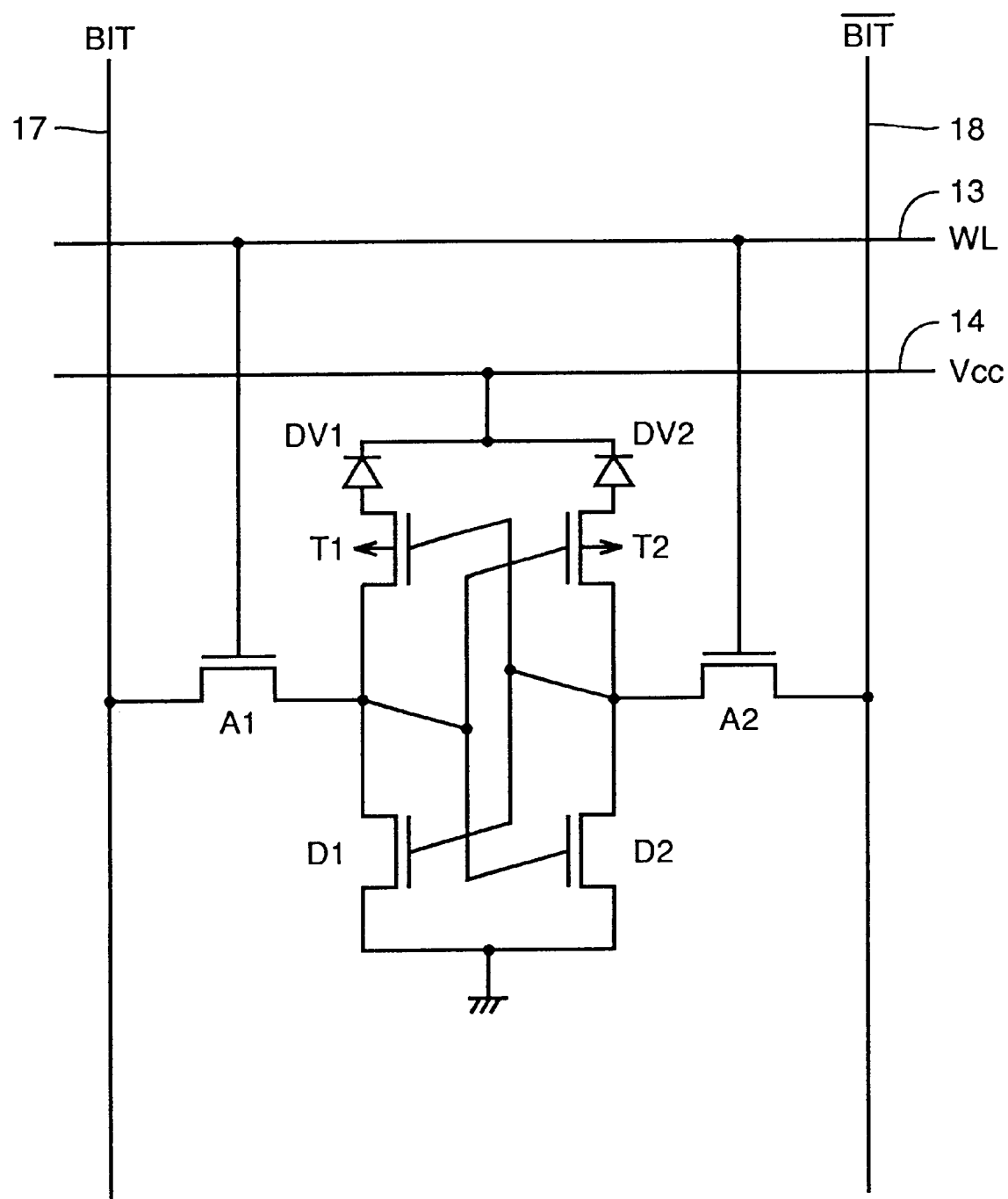
FIG. 3 is an equivalent circuit diagram of a memory cell of the SRAM shown in FIG. 1 according to the embodiment 1 of the invention.

Referring to FIG. 3, it is now assumed that DV1 represents the rectifier element formed at contact region 51 (FIG. 2) between power supply interconnection 40 (FIG. 2) and source region 5a (FIG. 2) of load transistor T1 (FIG. 1), and that DV2 represents the rectifier element formed at the contact region between the power supply interconnection 41 (FIG. 1) and source region 6a (FIG. 1) of load transistor T2 (FIG. 1). In this case, rectifier elements DV1 and DV2 are located between power supply line 14 and load transistor T1, and between power supply line 14 and load transistor T2, respectively.

Figure 4:
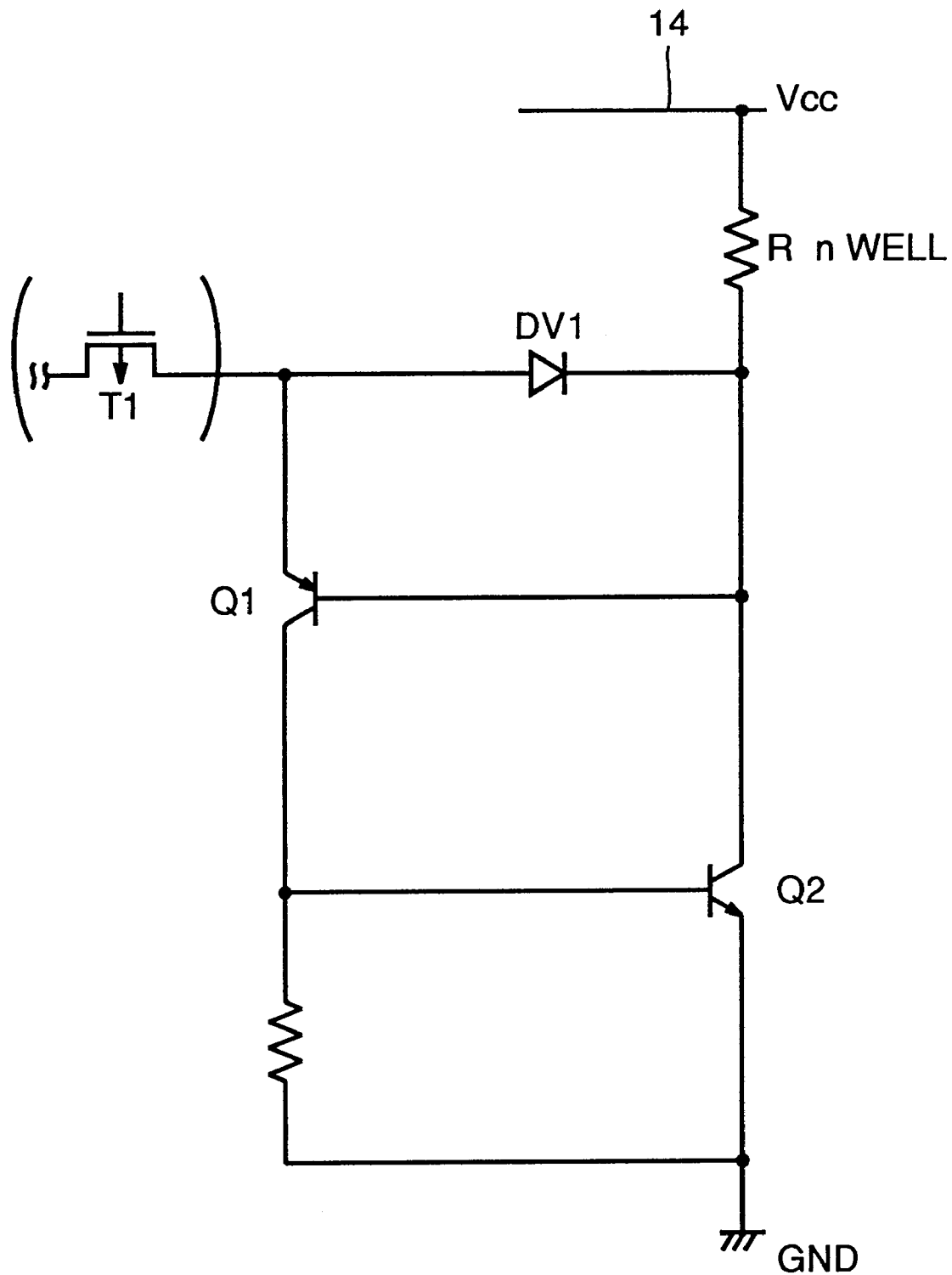
FIG. 4 is an equivalent circuit diagram of a thyristor parasitically formed in the SRAM of the embodiment 1 of the invention shown in FIG. 2.

In the memory cell of the SRAM according to the embodiment 1 of the invention, two bipolar transistors are parasitically formed as shown in FIG. 2. More specifically, there is formed a pnp bipolar transistor Q1 (FIG. 4) having a first emitter electrode formed of source region 5a of load transistor T1, a first base electrode formed of n-type well 38 and a first collector electrode formed of p-type well 39, and there is also formed an npn bipolar transistor Q2 (FIG. 4) having a second collector electrode formed of n-type well 38, a second base electrode formed of p-type well 39 and a second emitter electrode formed of source region 11a of driver transistor D1. Bipolar transistors Q1 and Q2, which are formed parasitically as described above, parasitically form thyristor as shown in FIG. 4. Rectifier element DV1 formed at contact region 51 (FIG. 2), where power supply interconnection 40 (FIG. 2) is in contact with source region 5a (FIG. 2) of load transistor T1, is located between power supply line 14 and the first emitter electrode of pnp bipolar transistor Q1.

In the memory cell of the SRAM according to the embodiment 1 of the invention, since power supply interconnection 40 (FIG. 2) is made of tungsten silicide doped with n-type impurity, rectifier element DV1 can be formed at the contact region 51 between the power supply interconnection 40 and source region 5a of load transistor T1. Thereby, parasitically formed bipolar transistor Q1 shown in FIG. 4 can be supplied on its first emitter electrode with the power supply current through rectifier element DV1. Also, bipolar transistor Q1 can be supplied on its first base electrode with the power supply current without passing through rectifier element DV1. Therefore, the power supply voltage applied to the first emitter electrode of bipolar transistor Q1 can always be lower than the power supply voltage applied to the first base electrode of bipolar transistor Q1. Thereby, it is possible to prevent occurrence of forward bias between the first emitter electrode and the first base electrode of bipolar transistor Q1 which is formed parasitically. Consequently, operation of the thyristor which is formed parasitically can be prevented even if a distance between source region 5a of load transistor T1 and source region 11a of driver transistor D1 as well as a width of isolating oxide film 35 are set to about 2.0 μm or less for subminiaturizing the memory cells of the SRAM in FIG. 2. As a result, the memory cells of the SRAM can be subminiaturized while preventing latch up. Power supply interconnections 40 and 41 may be made of titanium silicide or silicide of another kind of refractory metal, or may be made of polycrystalline silicon, in which case an effect can be likewise achieved. In the above embodiment, n-type impurity is implanted into tungsten silicide. However, power supply interconnection 40 may be made of polycrystalline silicon not doped with impurity or silicide of refractory metal such as tungsten silicide. In this case, a rectifier element can likewise be formed at contact region 51, and power supply interconnection 40 can have a large electrically resistance. Thereby, the power supply applied to the first emitter electrode of bipolar transistor Q1 can always be lower than the power supply voltage applied to the first base electrode of bipolar transistor Q1.

The distance between source region 5a of load transistor T1 and source region 11a of driver transistor D1 is set to 2.0 μm and thus is significantly reduced compared with the prior art utilizing a substrate resistance for preventing latch up. Therefore, the structure of the semiconductor device can be subminiaturized to a higher extent than the prior art.

Since isolating oxide film 35 is formed at the main surface of semiconductor substrate 37 between source region 5a of load transistor T1 and source region 11a of drain region D1, source regions 5a and 11a of load transistor T1 and driver transistor D1 can be formed in a self-aligned manner in the manufacturing step, which will be described later.

Since the SRAM according to the embodiment 1 of the invention uses the field-effect transistors as load transistors T1 and T2, six field-effect transistors A1, A2, D1, D2, T1 and T2 must be arranged at the surface of semiconductor substrate 37. These field-effect transistors are larger in number than field-effect transistors in a memory cell of another type of semiconductor memory device, and the memory cell in this SRAM has a larger size than that of another type of semiconductor memory device. In the SRAM according to the embodiment 1 of the invention, however, it is not necessary to keep a long distance between field-effect transistors T1 and D1 in contrast to the conventional SRAM, because rectifier elements DV1 and DV2 prevent the lath up. Therefore, the effect on subminiaturization of memory cells can be achieved especially remarkably in the SRAM which uses the field-effect transistors as the load elements, and thus includes memory cells each having field-effect transistors larger in number than that in another type of semiconductor memory device.

As shown in FIG. 1, power supply interconnections 40 and 41 are formed for each memory cell in the SRAM so that rectifier elements DV1 and DV2 (FIG. 3) are formed for each memory cell. Therefore, power supply interconnections 40 and 41 in each memory cell can contain the n-type impurity at the concentration which can be variable set independently of those in the other memory cells. Thereby, the reverse resistances of rectifier elements DV1 and DV2 formed for each memory cell can be variable set independently of the other memory cells. Accordingly, the reverse resistances of rectifier elements DV1 and DV2 can be variable set in accordance with electric characteristics of the semiconductor elements in each memory cell, and therefore latch up can be prevented more reliably.

Instead of phosphorus which is n-type impurity, p-type impurity such as boron may be implanted into power supply interconnections 40 and 41. The implantation of boron may be performed under the conditions of a dose of about $1.0 \times 10^{15}$ PCs/cm$^2$ and an implantation energy of about 20 keV. Referring to FIG. 2, if p-type impurity is implanted into power supply interconnection 40 under these conditions, a pn junction serving as rectifier element DV1 is formed at the contact region between the power supply interconnection 40 and n-type impurity diffusion region 3. Even if rectifier element DV1 is formed as described above, rectifier element DV1 can be formed on a current path of the power supply current between power supply line 14 and source region 5a of load transistor T1, i.e., first emitter electrode of parasitic transistor Q1 (FIG. 4) so that it is possible to achieve an effect similar to the effect achieved by implantation of n-type impurity into power supply interconnection 40.

Referring to FIGS. 5 to 14, description will be given on steps of manufacturing the SRAM according to the embodiment 1 of the invention.

Figure 5:
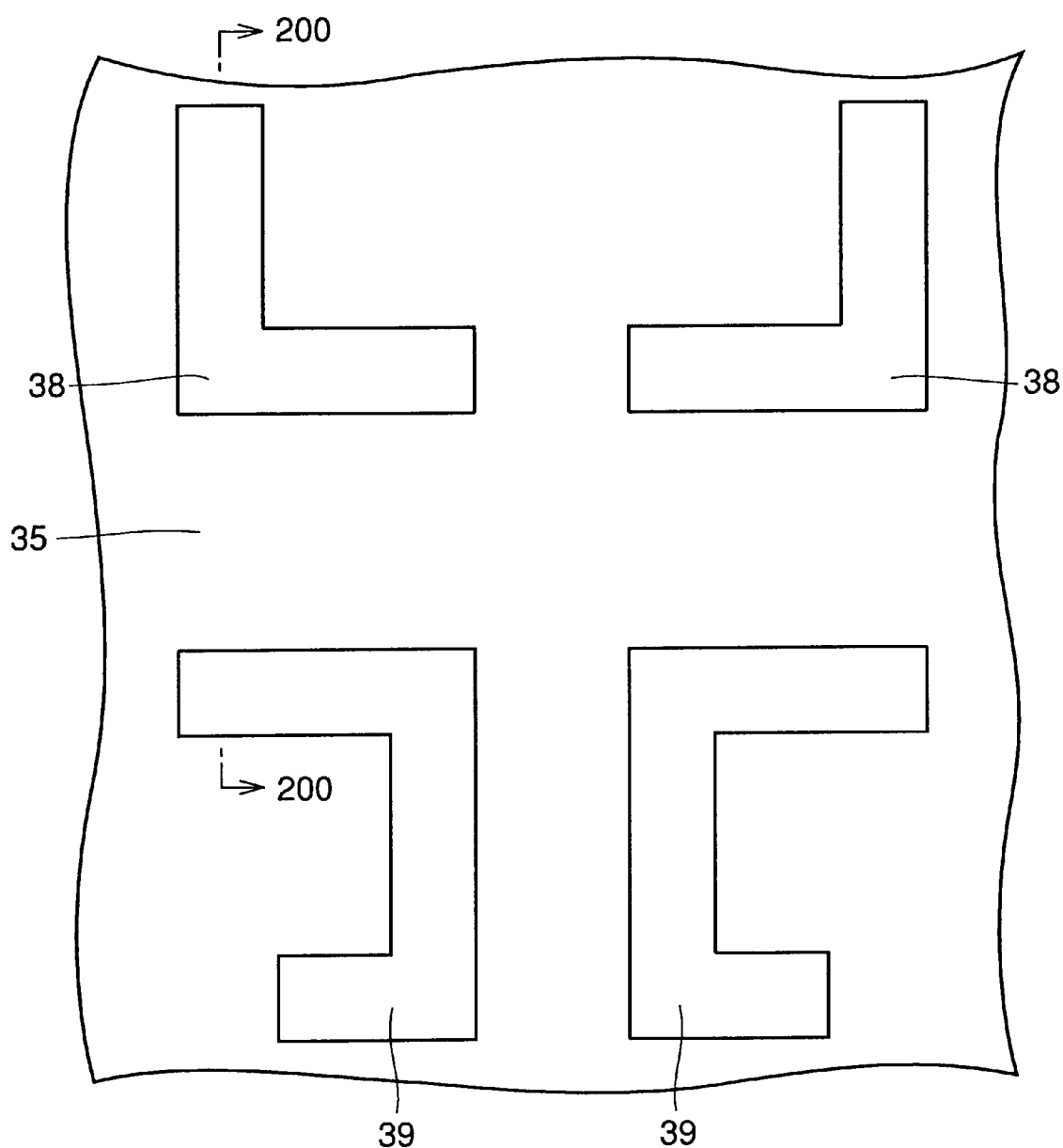
FIG. 5 is a layout plan showing a 1st step of manufacturing the SRAM of the embodiment 1 of the invention shown in FIG. 1.

Impurity is implanted into the main surface of semiconductor substrate 37 (FIG. 6) to form n-type well 38 and p-type well 39. A silicon oxide film (not shown) is formed at the main surface of semiconductor substrate 37. A silicon nitride film (not shown) is formed on this silicon oxide film. A resist pattern is formed on this silicon nitride film, and then anisotropic etching is effected on the silicon oxide film and silicon nitride film using this resist pattern as a mask. After removing the resist pattern, the main surface of silicon substrate 37 is oxidized to form isolating oxide film 35 (FIG. 5). Thereafter, the silicon oxide film and silicon nitride film are removed to form the structure shown in FIGS. 5 and 6.

Figure 8:
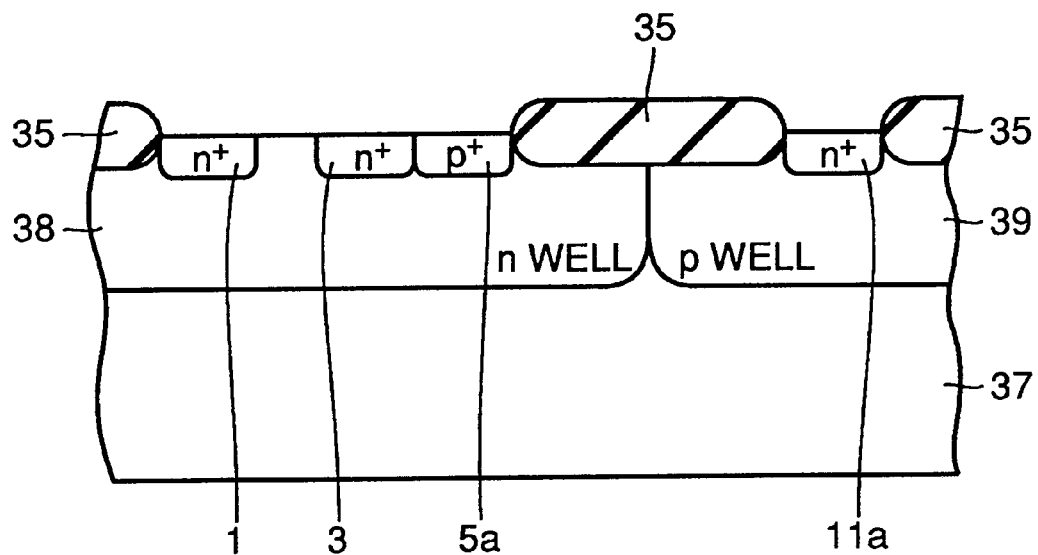
FIG. 8 is a cross section taken along line 200—200 in FIG. 7.

Then, a silicon oxide film (not shown) which will form the gate insulating film is formed over semiconductor substrate 37 (FIG. 6) and isolating oxide film 35. A doped polycrystalline silicon film (not shown) is formed over this silicon oxide film. A resist pattern is formed over this doped polycrystalline silicon film, and then anisotropic etching is effected on the silicon oxide film and the doped polycrystalline silicon film using the resist pattern as a mask. Thereby, word line 13 serving as the gate electrodes of access transistors A1 and A2, gate electrodes 7 of load transistor T1 and driver transistor D2, gate electrodes 8 of load transistor T2 and driver transistor D2, and gate insulating films (not shown) of these transistors A1, A2, T1, T2, D1 and D2 are formed as shown in FIG. 7. Thereafter, resist pattern is removed. n-type impurity is implanted into the main surface of semiconductor substrate 37 so that n-type impurity diffusion regions 11a–11c, 12a–12c and 1–4 are formed in a self-aligned manner. Boron, i.e., p-type impurity is implanted into the main surface of semiconductor substrate 37 so that p-type impurity diffusion regions 5a, 5b, 6a and 6b are formed in a self-aligned manner. In this manner, access transistors A1 and A2, driver transistors D1 and D2, and load transistors T1 and T2 are formed as shown in FIGS. 7 and 8.

Figure 9:
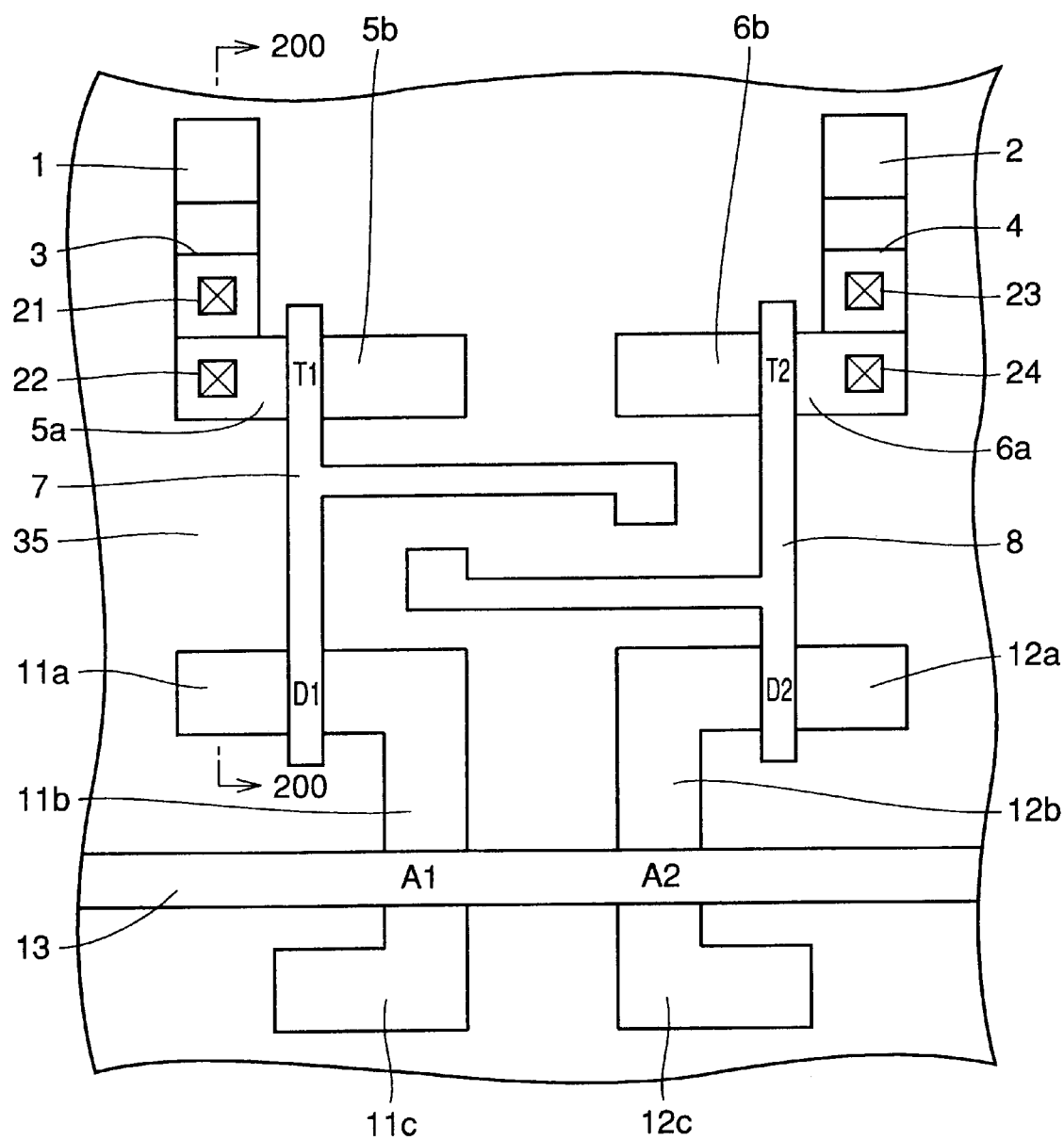
FIG. 9 is a layout plan showing a 3rd step of manufacturing the SRAM of the embodiment 1 of the invention shown in FIG. 1.
Figure 10:
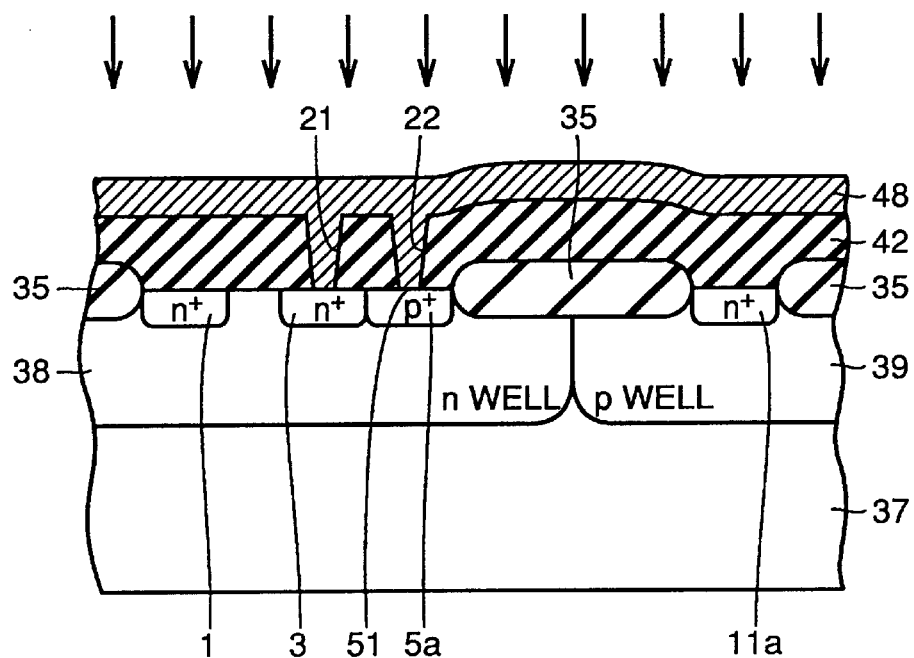
FIG. 10 is a cross section taken along line 200—200 in FIG. 9.

Then, first interlayer insulating film 42 (FIG. 10) made of a silicon oxide film is formed over the entire surface of semiconductor substrate 37. A resist pattern (not shown) is formed over interlayer insulating film 42. Anisotropic etching is effected on interlayer insulating film 42 using this resist pattern as a mask. Thereafter, resist pattern is removed. Thereby, contact holes 21–24 are formed as shown in FIG. 9. Tungsten silicide film 48 (FIG. 10) is formed in contact holes 21–24 and over interlayer insulating film 42. Phosphorus which is n-type impurity is implanted into tungsten silicide film 48. This implantation is performed under the conditions of a dose of about $1.0 \times 10^{20}$ PCs/cm$^2$ and an implantation energy of about 20 keV as shown in FIG. 10. Thereby, pn junctions serving as rectifier elements DV1 and DV2 (FIG. 3) can be formed at contact regions where power supply interconnections 40 and 41 (FIG. 1) are in contact with source regions 5a and 6a of load transistors T1 and T2, respectively. Since power supply interconnections 40 and 41 contain n-type impurity which are ion-implanted thereinto, doses of n-type impurity implanted into power supply interconnections 40 and 41 can be controlled by changing the conditions for this ion-implantation. As a result, reverse resistance values of rectifier elements DV1 and DV2 can be controlled to conform to the electric characteristics, and therefore the latch up can be prevented more reliably.

Figure 12:
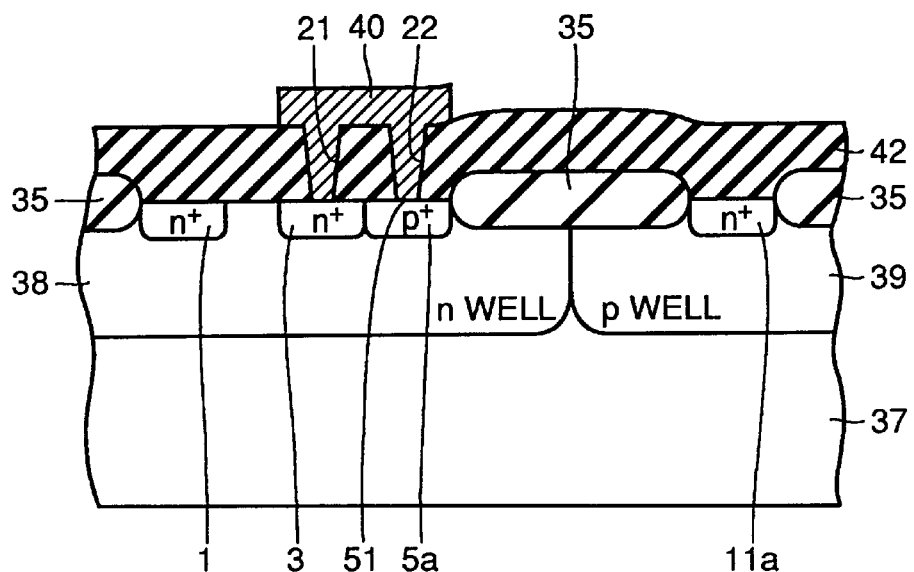
FIG. 12 is a cross section taken along line 200—200 in FIG. 11.

A resist pattern (not shown) is formed over tungsten silicide film 48. Anisotropic etching is effected on tungsten silicide film 48 using the resist pattern as a mask. Thereafter, the resist pattern is removed. Thereby, power supply interconnections 40 and 41 are formed as shown in FIGS. 11 and 12.

Figure 11:
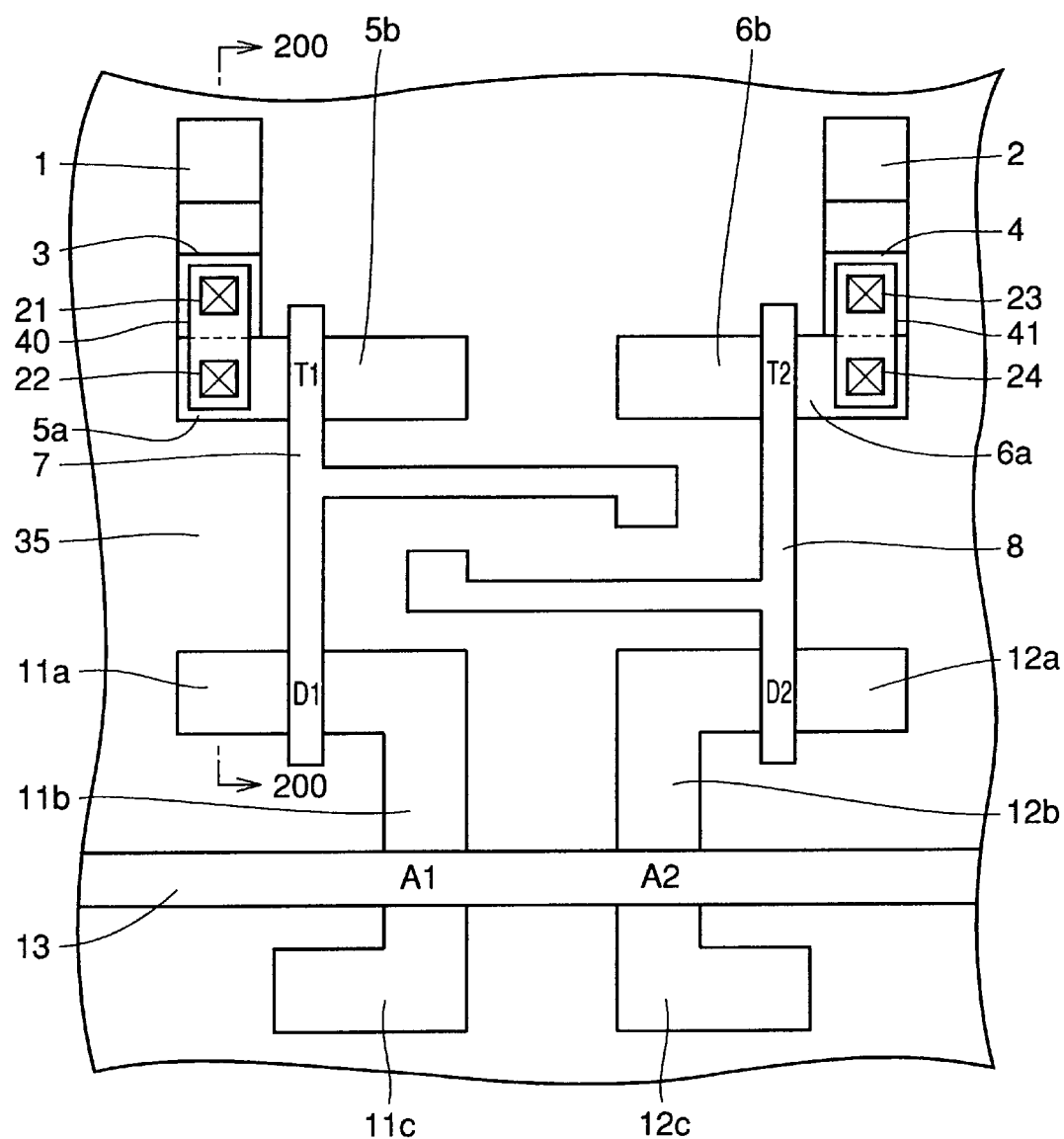
FIG. 11 is a layout plan showing a 4th step of manufacturing the SRAM of the embodiment 1 of the invention shown in FIG. 1.
Figure 13:
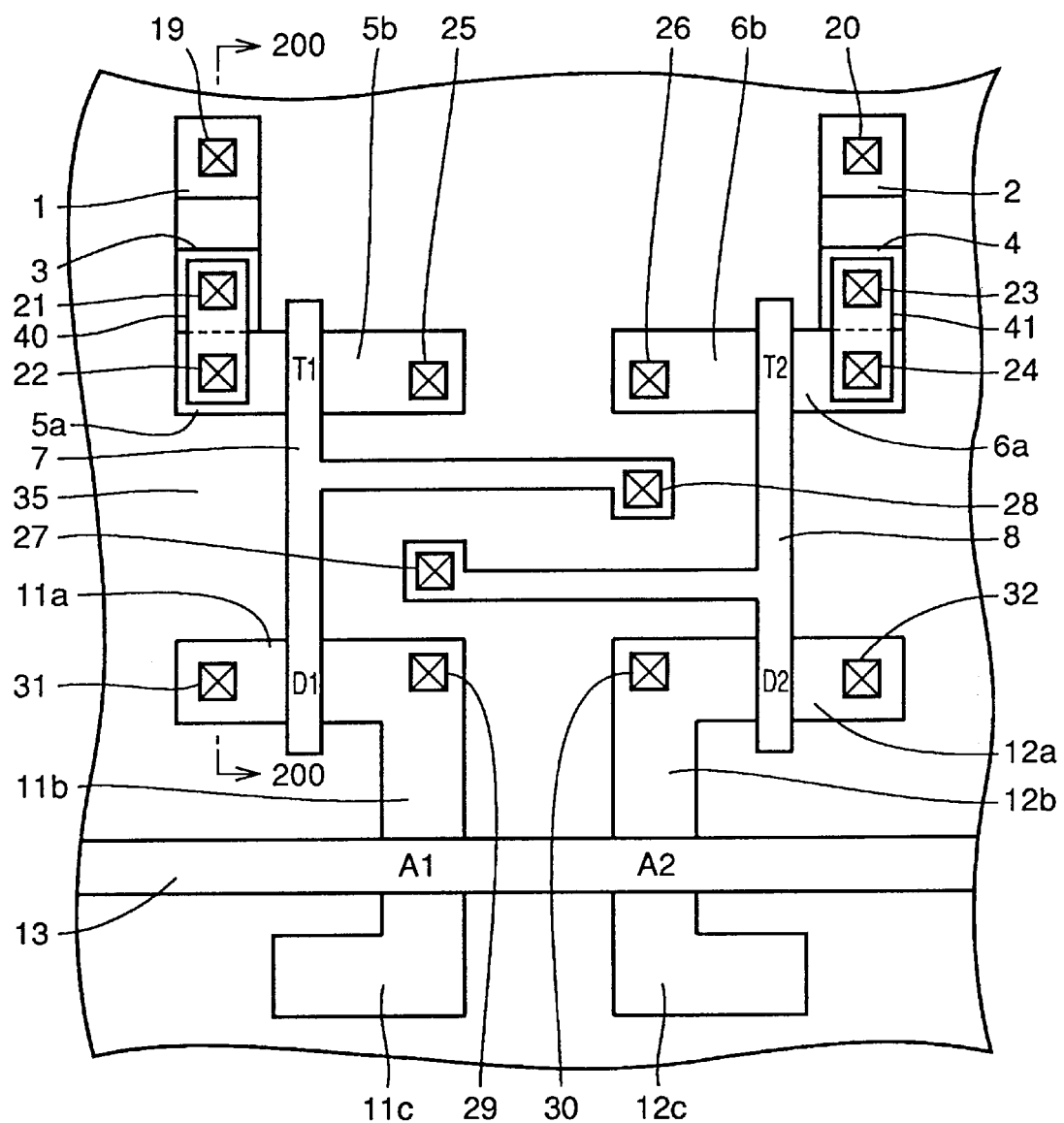
FIG. 13 is a layout plan showing a 5th step of manufacturing the SRAM of the embodiment 1 of the invention shown in FIG. 1.
Figure 14:
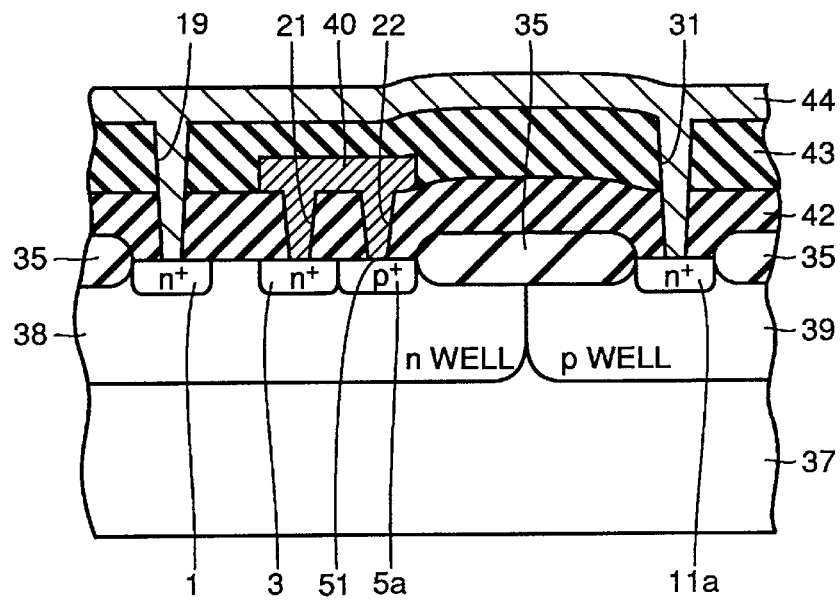
FIG. 14 is a cross section taken along line 200—200 in FIG. 13.

Second interlayer insulating film 43 (FIG. 14) is formed over first interlayer insulating film 42 (FIG. 12) and power supply interconnections 40 and 41 (FIG. 11). Anisotropic etching is effected on first and second interlayer insulating films 42 (FIG. 14) and 43 using this resist pattern as a mask. Thereafter, the resist pattern is removed. Thereby, contact holes 19, 20 and 25–32 are formed as shown in FIG. 13. A first aluminum film 44 (FIG. 14) is formed on second interlayer insulating film 43 and in contact holes 19, 20 and 25–32 as shown in FIGS. 13 and 14.

Thereafter, a resist pattern (not shown) is formed over first aluminum film 44. Anisotropic etching is effected on first aluminum film 44 using this resist pattern as a mask. Thereby, power supply line 14, internal interconnections 9 and 10 of the memory cell, and ground lines 15 and 16 are formed as shown in FIG. 1. After forming third interlayer insulating film 49 (FIG. 2) covering the entire surface, a resist pattern (not shown) is formed over third interlayer insulating film 49. Anisotropic etching is effected on first to third interlayer insulating films 42, 43 and 49 using this resist pattern as a mask. Thereafter, the resist pattern is removed. Thereby, contact holes 33 and 34 (FIG. 1) are formed. A second aluminum film (not shown) is formed in contact holes 33 and 34 and over third interlayer insulating film 49. The second aluminum film masked with this resist pattern is partially removed to form bit line 17 and complementary bit line 18 shown in FIG. 1. Thereafter, the resist pattern is removed. In this manner, the memory cell of the SRAM shown in FIG. 1 is completed.

Figure 15:
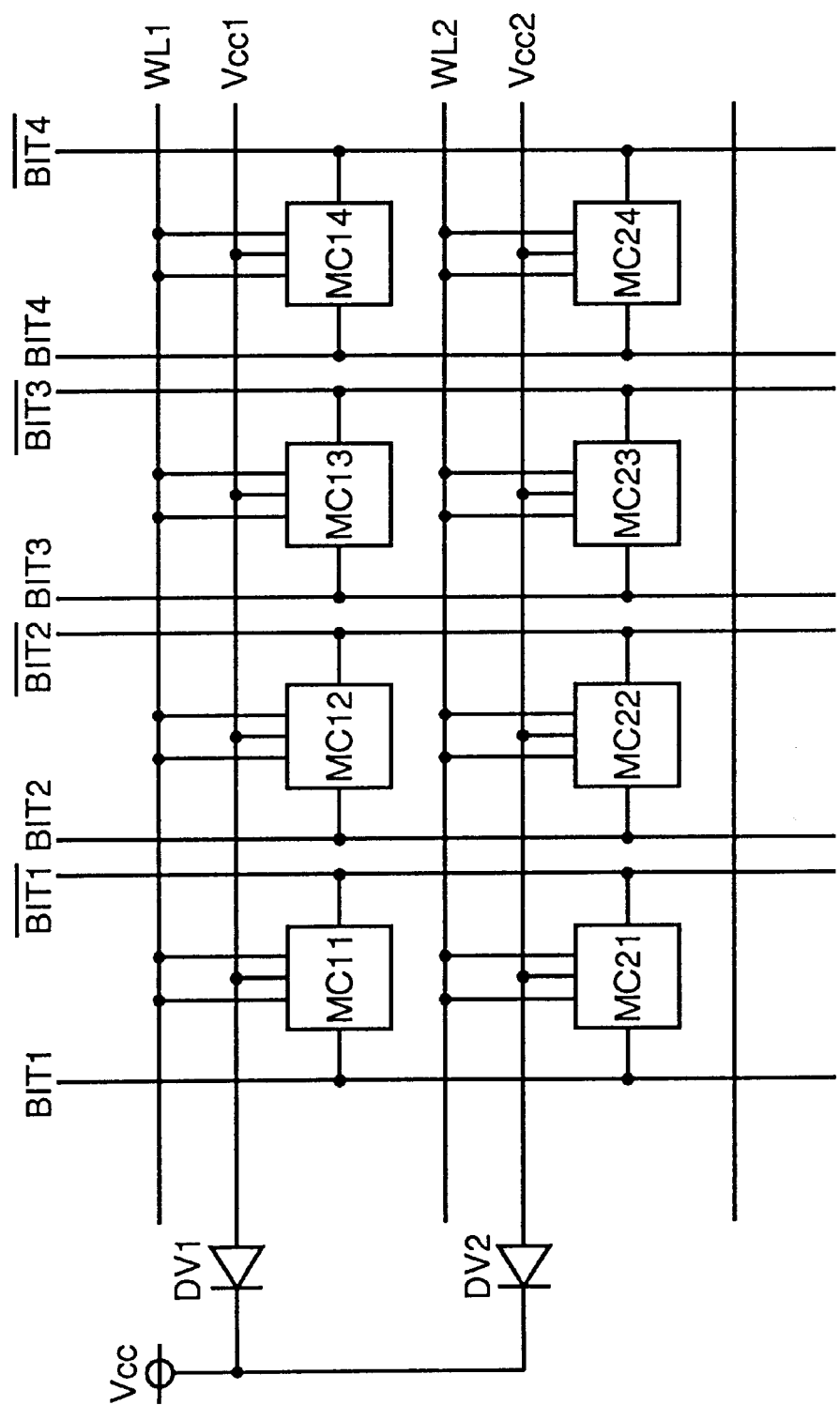
FIG. 15 is a circuit diagram of a modification of the SRAM according to the embodiment 1 of the invention shown in FIG. 1.

In the memory cell of the SRAM according to the embodiment 1 of the invention, rectifier elements DV1 and DV2 are formed for each of the memory cells. Alternatively, as shown in FIG. 15, one rectifier element DV1 or DV2 may be formed for a plurality of memory cells MC11–MC14, MC21–MC24. In this structure, the rectifier elements can be reduced in number compared with the structure wherein rectifier elements DV1 and DV2 are formed for each memory cell. Thereby, the structure of the memory cell in the SRAM can be further simplified, and the memory cells in the SRAM can be further subminiaturized.

Figure 16:
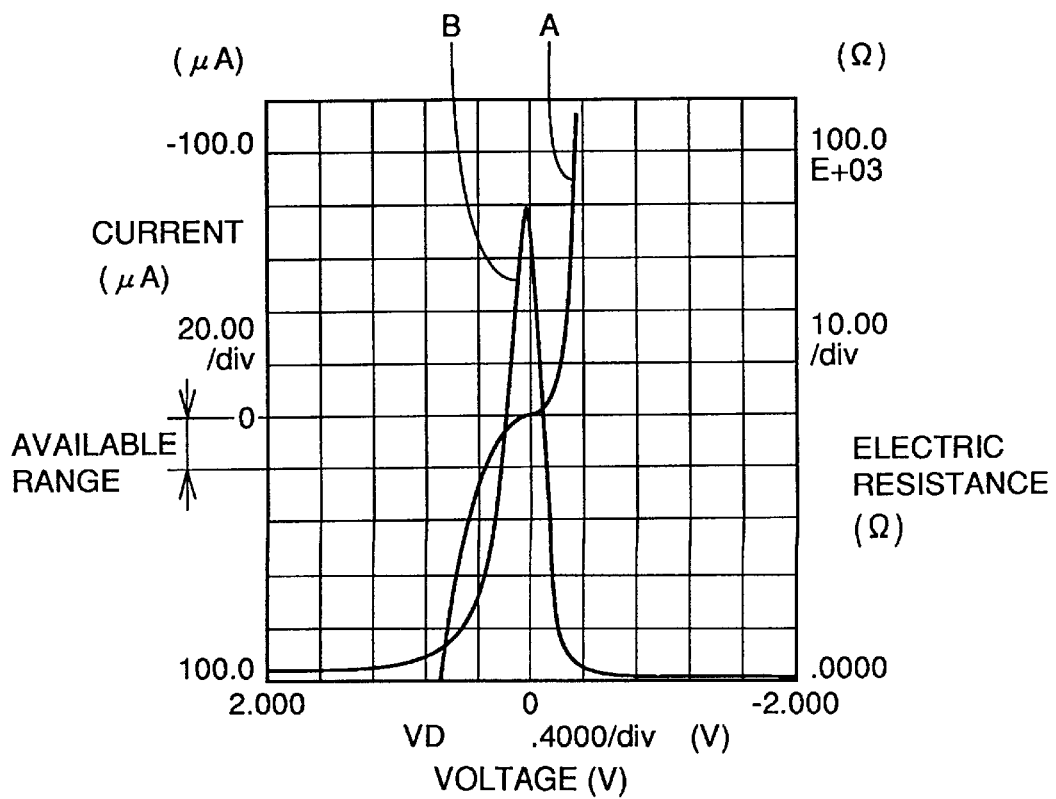
FIG. 16 is a graph showing electric characteristics of a rectifier in a memory cell of the SRAM according to the embodiment 1 of the invention shown in FIG. 1.

Referring to FIG. 16, the abscissa in the graph shown in FIG. 16 gives a voltage. The first ordinate in this graph gives a current value, and a second ordinate gives an electric resistance. Curve A shows the current values with the voltage of various values applied to rectifier elements DV1 and DV2 in the embodiment 1 of the invention. Curve B represents change in resistance value with change in voltage. In the embodiment 1 of the invention, values of the currents supplied through rectifier elements DV1 and DV2 in the SRAM are in a range from 0 to 20 μA, and rectifier elements DV1 and DV2 under these conditions have reverse resistances in a range from 40 to 50 kΩ. In the embodiment 1 of the invention, load transistors T1 and T2 in the SRAM have ON resistances of about 500 kΩ. The memory cells in the SRAM according to the embodiment 1 of the invention, which are provided with the rectifier elements having the reverse resistances of 40–50 kΩ, operated stably.

With the SRAM according to the embodiment 1, a voltage (latch-up durability) causing the latch up was measured by a capacitor charging method. For comparison, a test was conducted by a similar capacitor charging method on a memory cell in a conventional SRAM utilizing a substrate resistance for preventing latch up. In the memory cell of the conventional SRAM for the test, distance L (FIG. 2) of 2.0 μm was kept between source region 5a (FIG. 2) of load transistor T1 and source region 11a (FIG. 2) of driver transistor D1. Results are shown in a table 1. As shown in the table 1, latch up occurred in the conventional SRAM when a voltage of ±150 V was applied as the power supply voltage of which specified value is 3.2 V. In contrast to this, latch up did not occur in the SRAM according to the embodiment 1 of the invention even when a large voltage of 1200 V was applied as the power supply voltage.

TABLE 1

| Test Results of Latch Up Durability | |
| --- | --- |
| | Latch Up Durability (Voltage Causing Latch Up) |
| Conventional SRAM | ±150 V |
| SRAM of embodiment 1 | No latch up occurred with 1200 V |

Test method: capacitor charging method
Specified power supply voltage: 3.2 V
Distance between p- and n-type impurity regions: 2.0 μm Samples which employed rectifier elements DV1 and DV2 having reverse resistances of 5 kΩ and 50 MΩ were tested. From the results, it was found that the memory cells in the SRAMs having such rectifier elements stably operated, and could achieve the substantially same result as the sample of the embodiment 1 in the test by the capacitor charging method.

Embodiment 2

Figure 17:
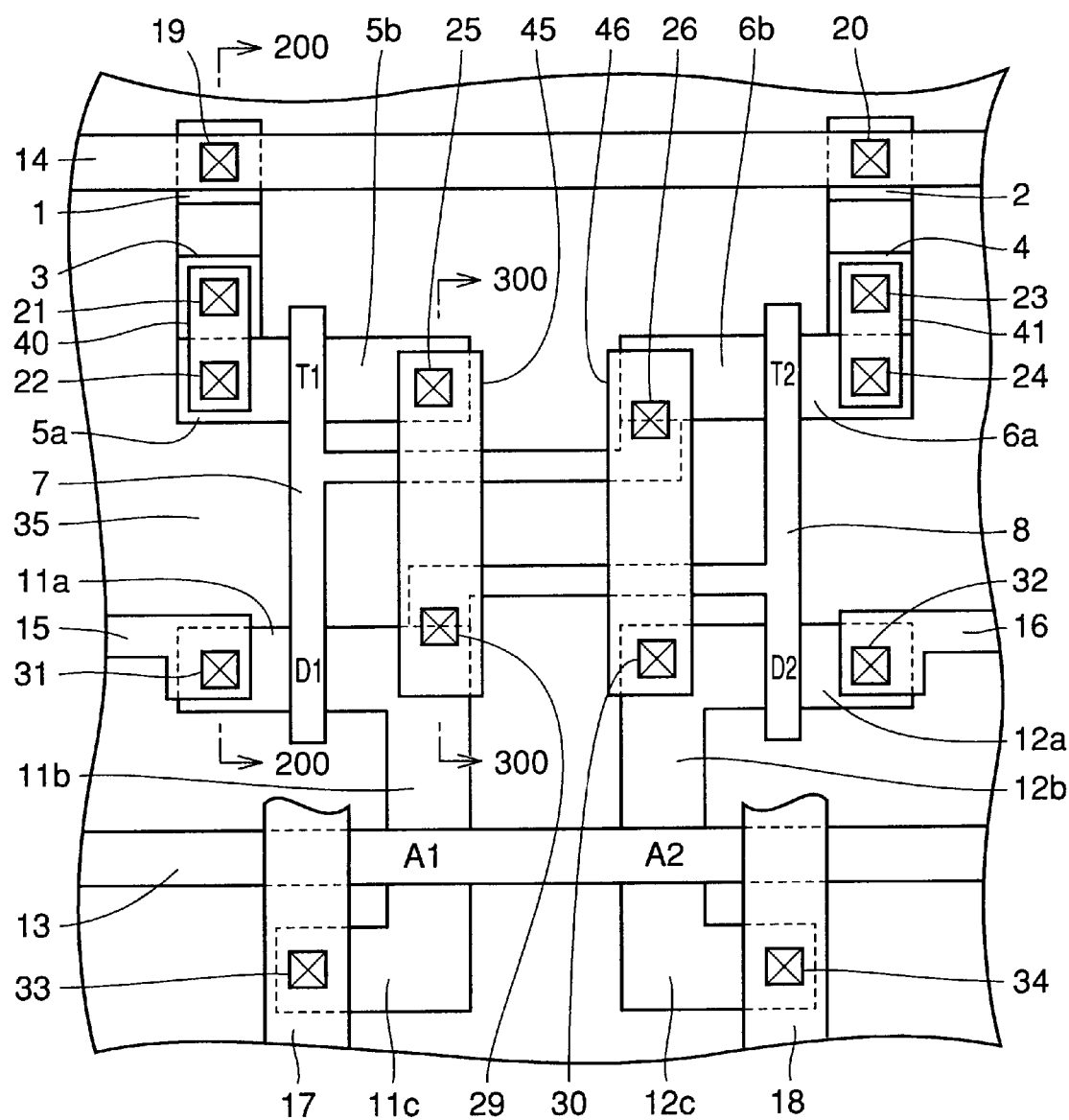
FIG. 17 is a layout plan of a memory cell of an SRAM according to an embodiment 2 of the invention.

Referring to FIG. 17, a memory cell of an SRAM according to an embodiment 2 of the invention will now be described below.

The memory cell of the SRAM according to the embodiment 2 of the invention shown in FIG. 17 basically has the substantially same structure as the memory cell of the SRAM according to the embodiment 1 of the invention shown in FIG. 1. However, the memory cell of the SRAM according to the embodiment 2 of the invention differs from that of the embodiment 1 in that internal interconnections 45 and 46 are made of tungsten silicide films, which are the same as the material of power supply interconnections 40 and 41. In the memory cell of the SRAM according to the embodiment 1 of the invention shown in FIG. 1, gate electrodes 7 and 8 of load transistors T1 and T2 and driver transistors D1 and D2, drain regions 11b and 12b of driver transistors D1 and D2 and drain regions 5b, 6b of load transistor T1 and T2 are connected to internal interconnections 9 and 10 through independent contact holes 25–30, respectively. In the memory cell of the SRAM according to the embodiment 2 of the invention, however, each of internal interconnections 45 and 46 shown in FIG. 17 is connected to gate electrode 7 or 8 and drain region 11b of driver transistor D1 or drain region 6b of load transistor T2 through corresponding one of contact holes 29 and 26. The sectional structure taken along line 200—200 is similar to that of the SRAM according to the embodiment 1 of the invention shown in FIG. 2.

Figure 18:
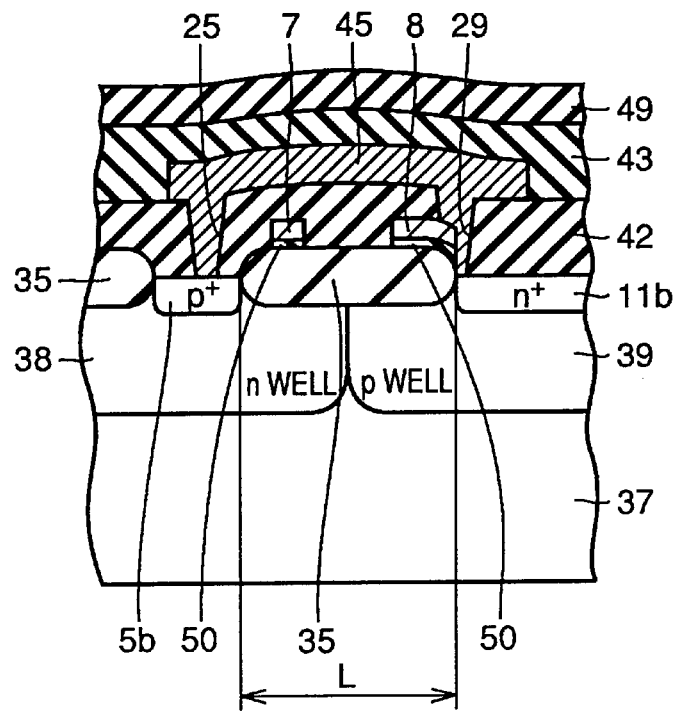
FIG. 18 is a cross section of a structure taken along line 300—300 in FIG. 17.

Referring to FIG. 18, semiconductor substrate 37 is provided at its main surface with n-type well 38 and p-type well 39. Semiconductor substrate 37 is provided at a predetermined region of main surface with isolating oxide film 35. Drain region 5b of load transistor T1 (FIG. 17) is formed at the main surface of n-type well 38. n-type impurity diffusion region 11b, which is a drain region of driver transistor D1 and is also one of source/drain regions of access transistor A1 (FIG. 17), is formed at the main surface of p-type well 39. Gate electrodes 7 of load transistor T1 and driver transistor D1 as well as gate electrodes 8 of load transistor T2 and driver transistor D2 are formed at predetermined regions on isolating oxide film 35 with oxide films 50 therebetween.

First interlayer insulating film 42 is formed over the main surface of semiconductor substrate 37, isolating oxide film 35 and gate electrodes 7 and 8. Contact holes 25 and 29 are formed at portions from which first interlayer insulating film 42 is removed. Internal interconnection 45 made of tungsten silicide film is formed in contact holes 25 and 29 and on first interlayer insulating film 42. At the bottom of contact hole 25, internal interconnection 45 is in contact with drain region 5b of load transistor T1. At the bottom of contact hole 29, internal interconnection 45 is in contact with gate electrode 8 and n-type impurity diffusion region 11b.

Second interlayer insulating film 43 is formed over internal interconnection 45 and first interlayer insulating film 42. Third interlayer insulating film 49 is formed over second interlayer insulating film 43. Since internal interconnection 45 is in contact with gate electrode 8 and n-type impurity diffusion region 11b at the bottom of contact hole 29, it is not necessary to form independent contact holes 27 and 29 (FIG. 1) for gate electrode 8 and n-type impurity diffusion region 11b, respectively, as is done in the embodiment 1 of the invention. Therefore, the contact holes can be reduced in number compared with the memory cell of the SRAM according to the embodiment 1 of the invention shown in FIG. 1. Consequently, it is possible, as shown in FIG. 18, to reduce distance L between source region 5b of load transistor T1 and source region 11a of driver transistor D1. Accordingly, the semiconductor device can be further subminiaturized, and the integration density thereof can be further increased. Since the power supply interconnections 40 and 41 are made of tungsten silicide, the interconnections 45 and 46 in the SRAM can be formed in the same step as power supply interconnections 40 and 41 as will be described later in connection with the manufacturing steps. Therefore, the structure in which rectifier elements DV1 and DV2 (FIG. 3) are formed at the contact regions between power supply interconnections 40 and 41 and source regions 5a and 6a of load transistors T1 and T2, respectively, does not significantly increase the number of steps of manufacturing the SRAM compared with the prior art.

Referring to FIGS. 19 to 26, description will be given on steps of manufacturing the memory cell of the SRAM according to the embodiment 2 of the invention.

Figure 6:
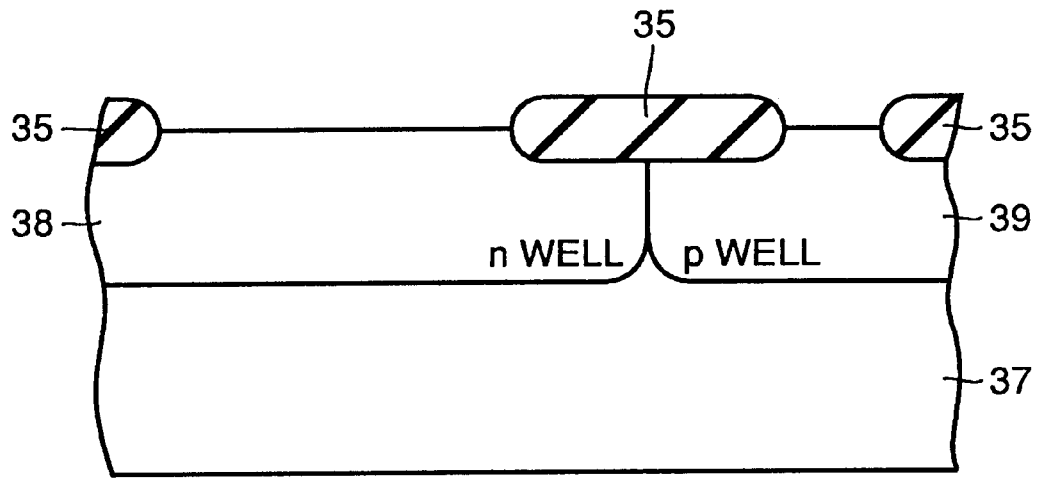
FIG. 6 is a cross section taken along line 200—200 in FIG. 5.
Figure 7:
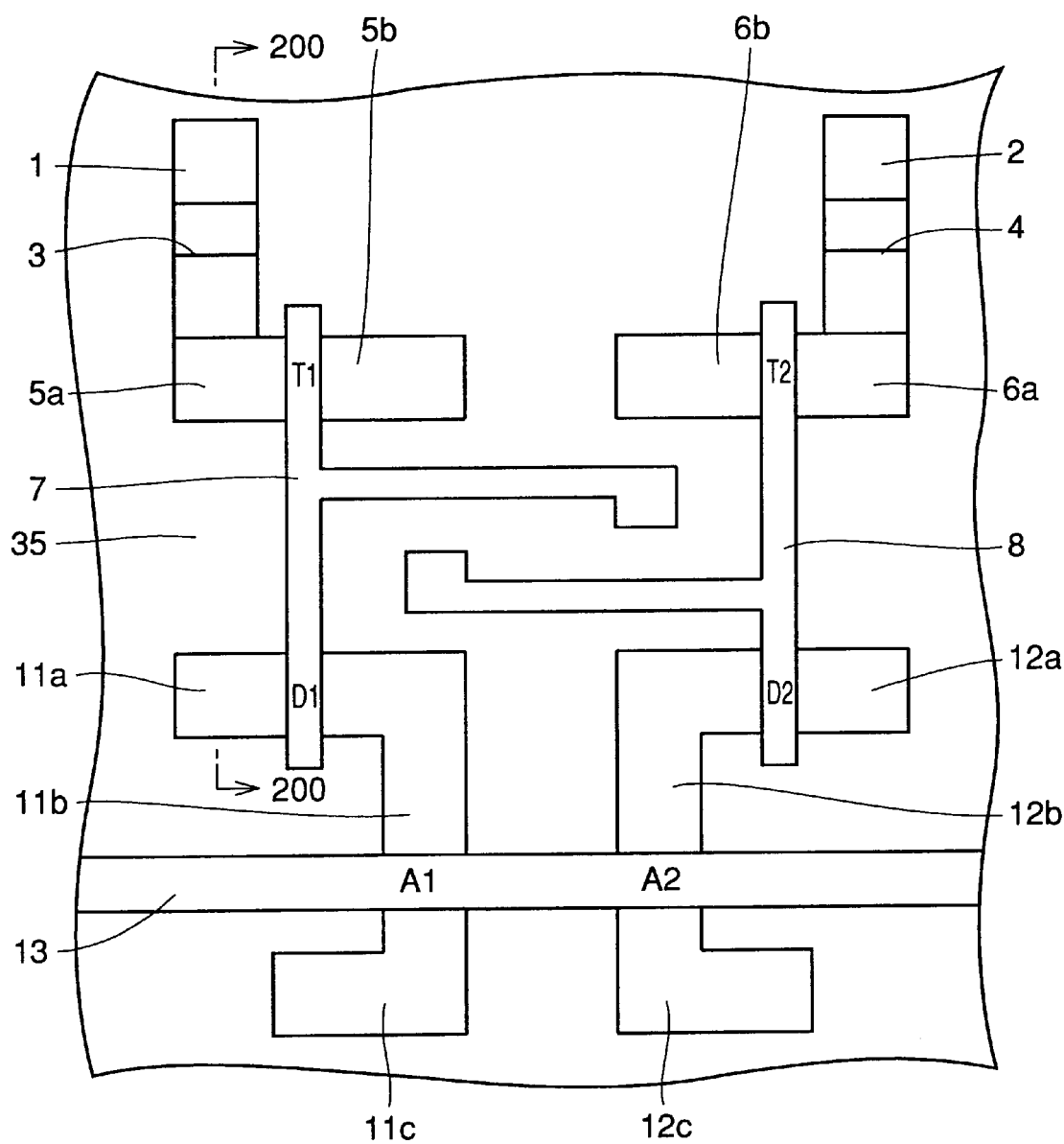
FIG. 7 is a layout plan showing a 2nd step of manufacturing the SRAM of the embodiment 1 of the invention shown in FIG. 1.
Figure 19:
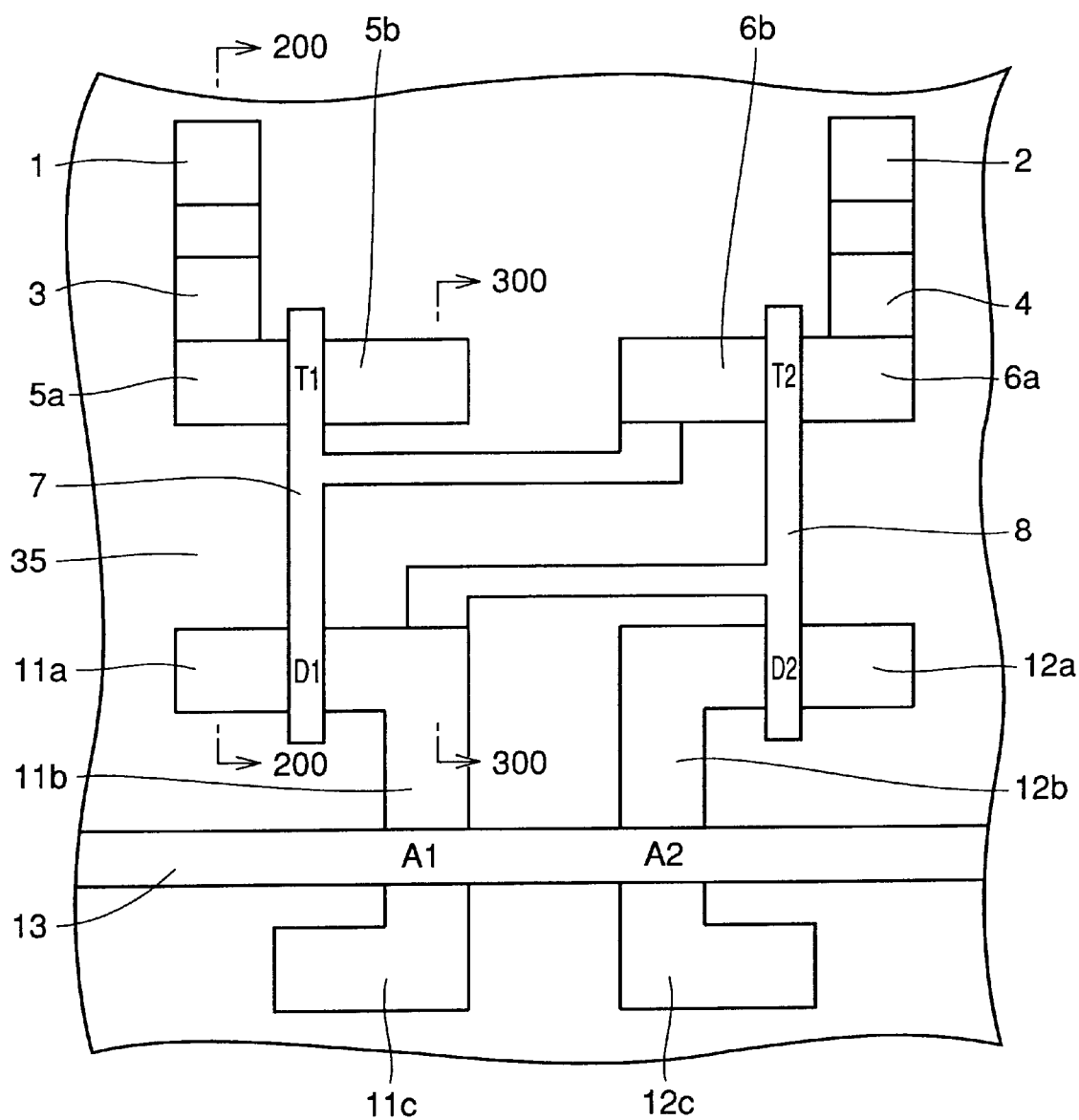
FIG. 19 is a layout plan showing a 1st step of manufacturing the SRAM according to the embodiment 2 of the invention shown in FIG. 17.

After a step which is the same as the manufacturing step for the SRAM according to the embodiment 1 of the invention shown in FIGS. 5 and 6, processing is performed to form gate insulating films 50 (FIG. 18) and gate electrodes 7 and 8 of load transistors T1 and T2 and driver transistors D1 and D2 as well as gate electrodes 13 and gate insulating films (not shown) of access transistors A1 and A2. The manufacturing step in FIG. 19 is basically the same as that for the SRAM according to the embodiment 1 of the invention shown in FIG. 7. However, gate electrode 7 has a portion extending near drain region 6b of load transistor T2 for the purpose of forming contact hole 26 (FIG. 17) in a later manufacturing step. For a similar reason, gate electrode 8 has a portion extending near drain region 11b of driver transistor D1. A sectional structure taken along line 200—200 in FIG. 19 is the same as that of the memory cell of the SRAM according to the embodiment 1 of the invention shown in FIG. 8.

Figure 20:
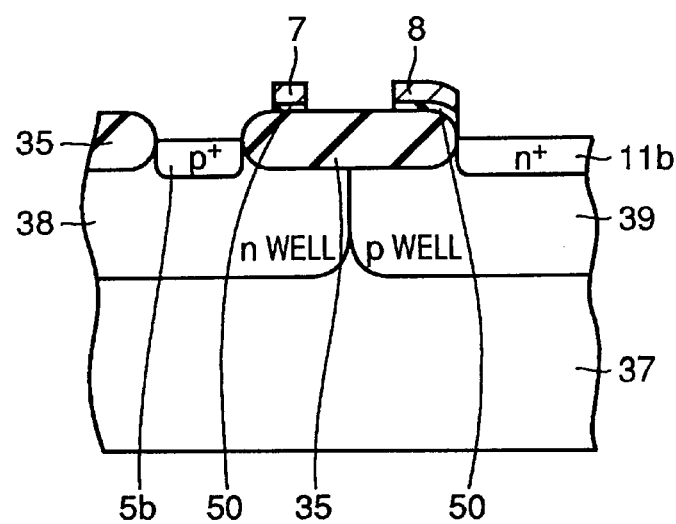
FIG. 20 is a cross section taken along line 300—300 in FIG. 19.

Referring to FIG. 20, semiconductor substrate 37 is provided at its main surface with n-type well 38 and p-type well 39. Semiconductor substrate 37 is provided at a predetermined region on its main surface with isolating oxide film 35. Drain region 5b of load transistor T1 is formed at the main surface of n-type well 38. Drain region 11b of driver transistor D1 is formed at the main surface of p-type well 39. Gate electrodes 7 of load transistor T1 and driver transistors D1 are formed at a predetermined region on isolating oxide film 35 with gate insulating film 50 therebetween. Gate electrodes 8 of load transistor T2 and driver transistor D2 are formed at a predetermined region on isolating oxide film 35 with gate insulating film 50 therebetween.

Figure 21:
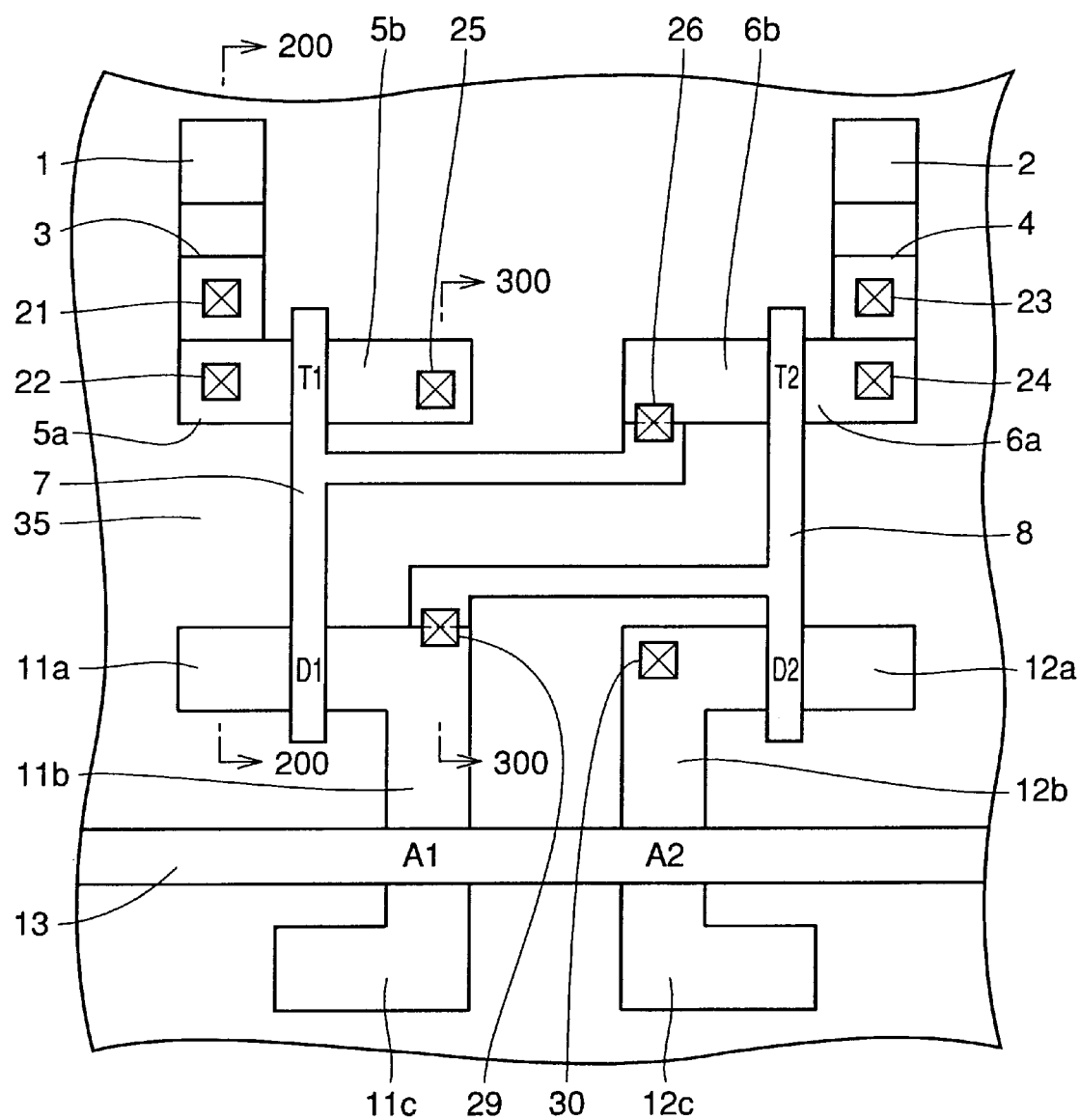
FIG. 21 is a layout plan showing a 2nd step of manufacturing the SRAM according to the embodiment 2 of the invention shown in FIG. 17.
Figure 22:
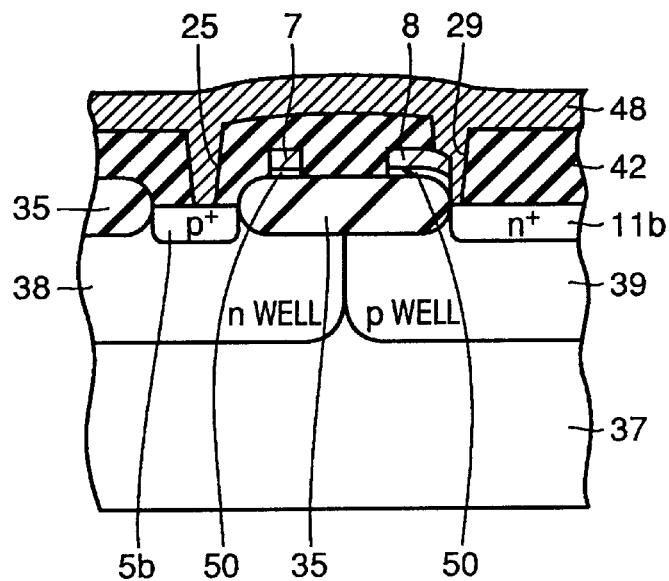
FIG. 22 is a cross section taken along line 300—300 in FIG. 21.
Figure 24:
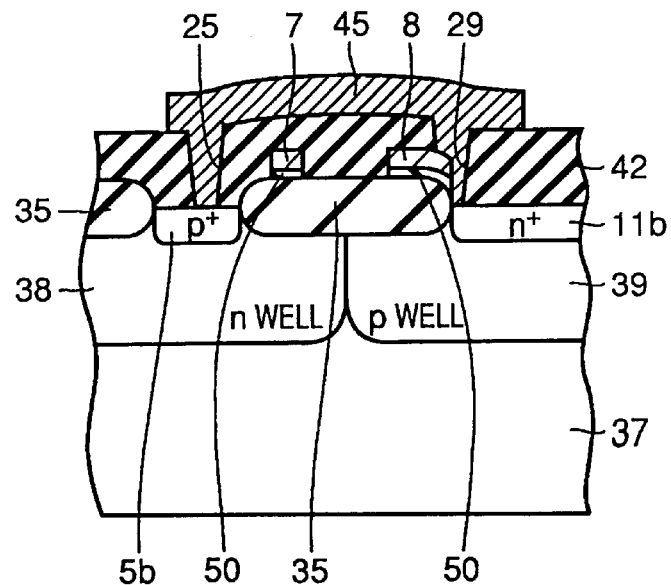
FIG. 24 is a cross section taken along line 300—300 in FIG. 23.

Processing is then performed to form first interlayer insulating film 42 (FIG. 18) covering the whole structure. Steps which are substantially the same as those for manufacturing the SRAM according to the embodiment 1 of the invention shown in FIG. 9 are performed to form contact holes 21–26, 29 and 30. Tungsten silicide film 48 (FIG. 22) is formed on first interlayer insulating film 42 and contact holes 21–26, 29 and 30. The sectional structure taken along line 200—200 in FIG. 21 is substantially the same as that of the SRAM according to the embodiment 1 of the invention shown in FIG. 10. As shown in FIG. 22, drain region 5b of load transistor T1 and tungsten silicide film 48 are in contact with each other at the bottom of contact hole 25. Also, at the bottom of contact hole 29, gate electrode 8 and drain region 11b of driver transistor D1 are in contact with tungsten silicide film 48.

Figure 23:
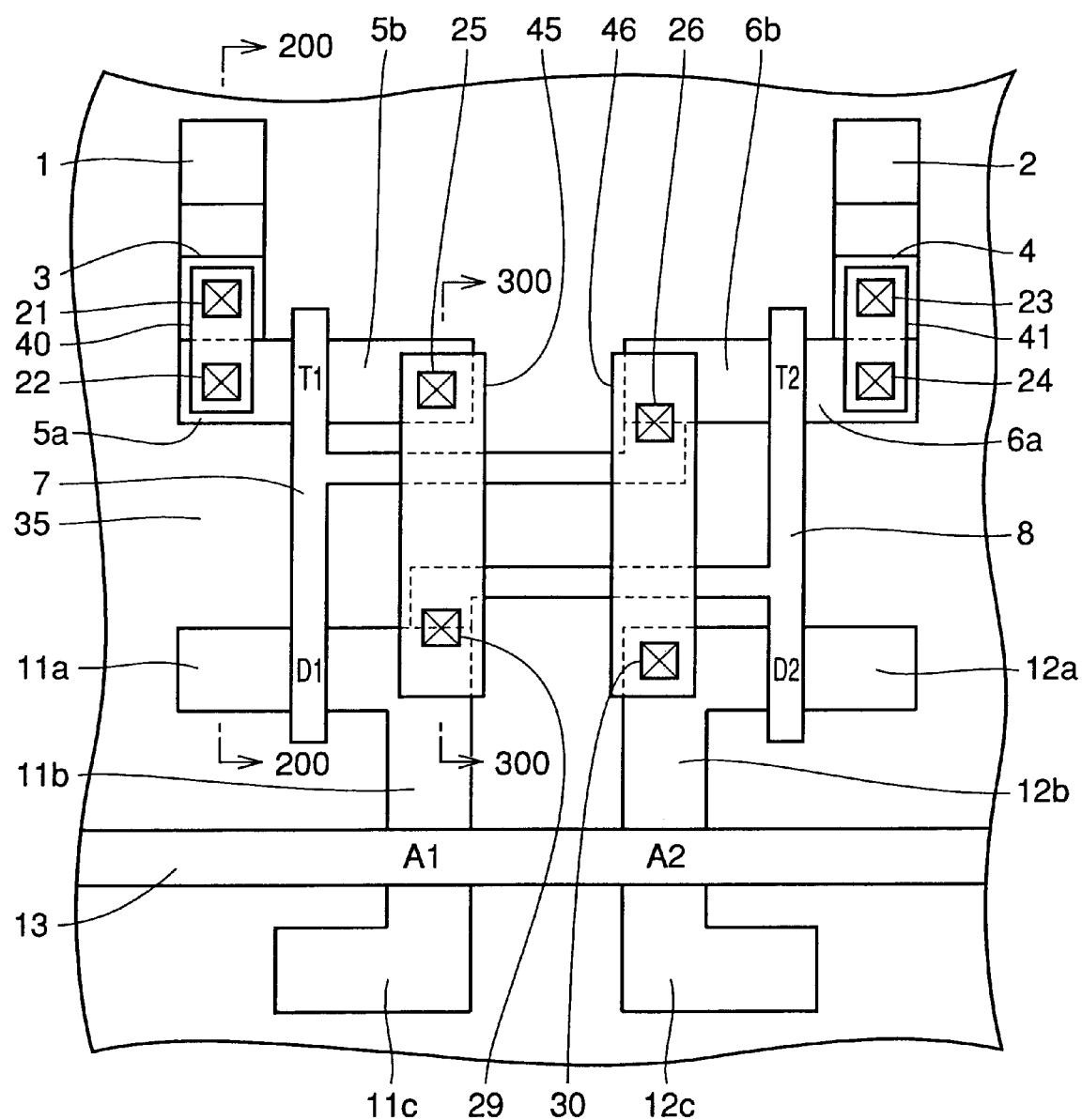
FIG. 23 is a layout plan showing a 3rd step of manufacturing the SRAM according to the embodiment 2 of the invention shown in FIG. 17.

Then, resist pattern (not shown) is formed on tungsten silicide film 48. Anisotropic etching is performed to remove portions of tungsten silicide film 48 using this resist pattern as a mask. In this manner, power supply interconnections 40 and 41 as well as internal interconnections 45 and 46 are formed as shown in FIG. 23. The sectional structure taken along line 200—200 in FIG. 23 is the substantially same as that of the memory cell of the SRAM according to the embodiment 1 of the invention shown in FIG. 12.

Figure 25:
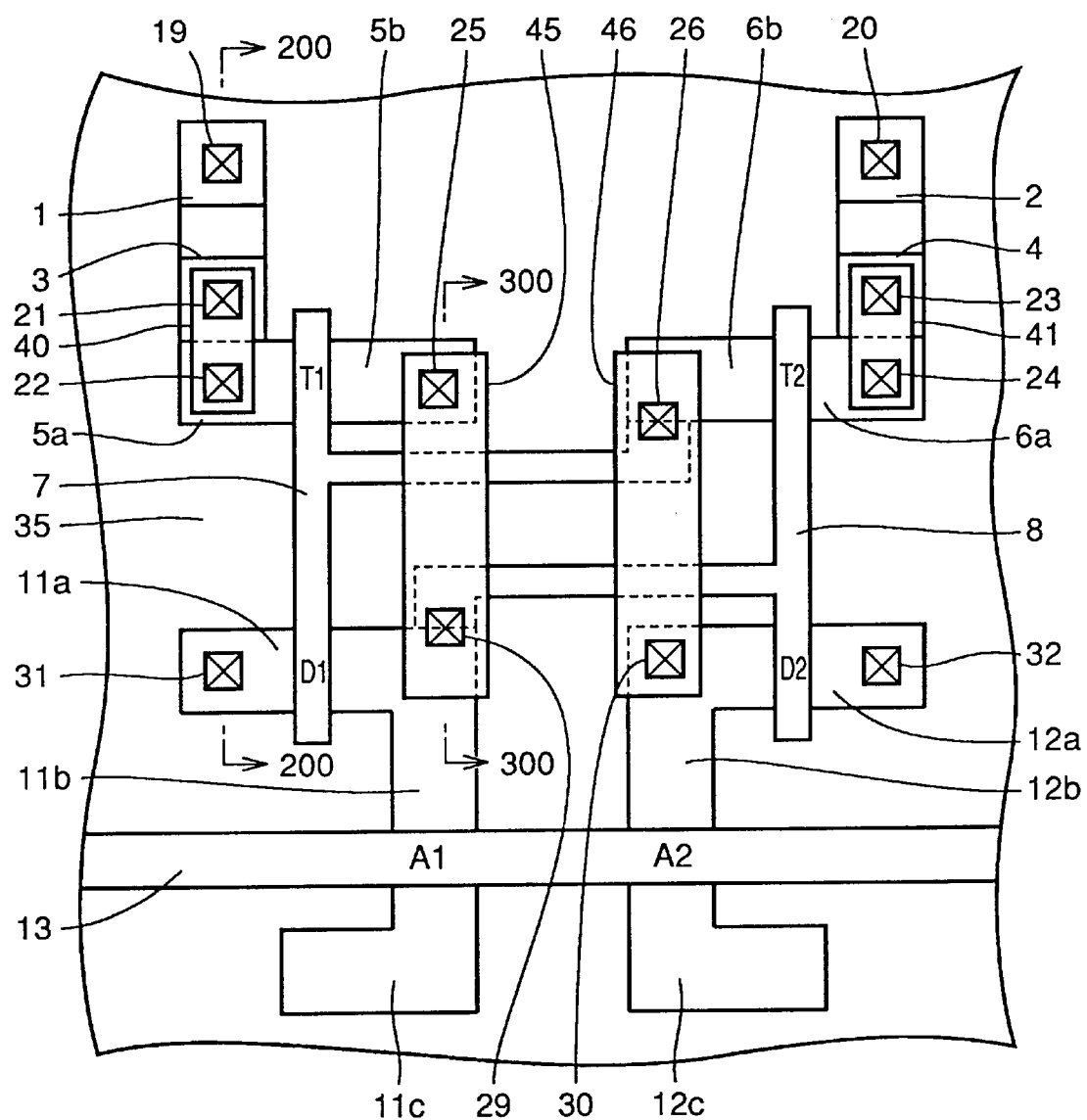
FIG. 25 is a layout plan showing a 4th step of manufacturing the SRAM according to the embodiment 2 of the invention shown in FIG. 17.
Figure 26:
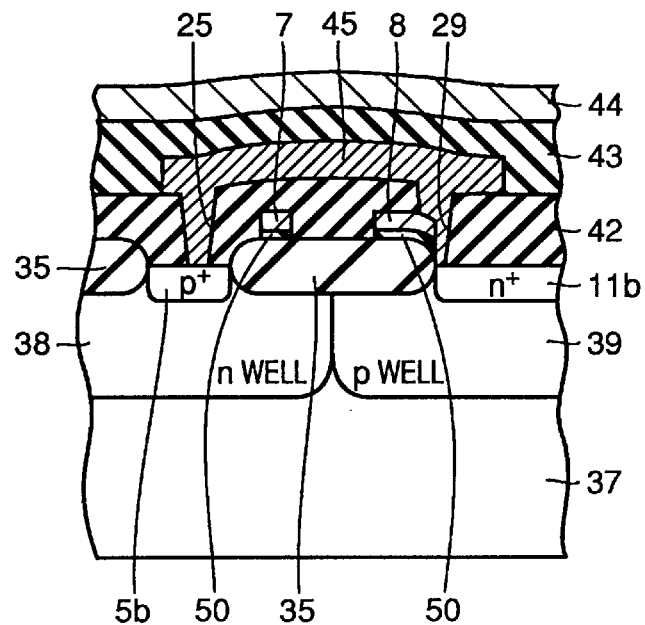
FIG. 26 is a cross section taken along line 300—300 in FIG. 25.

The manufacturing step shown in FIG. 25 is the substantially same as that for the SRAM according to the embodiment 1 of the invention shown in FIG. 13. However, the contact holes which are formed in this manufacturing step shown in FIG. 25 are only contact holes 19, 20, 31 and 32. Referring to FIG. 26, second interlayer insulating film 43 is formed on first interlayer insulating film 42 and internal interconnection 45. First aluminum film 44 is formed on second interlayer insulating film 43.

The sectional structure taken along line 200—200 in FIG. 25 is the substantially same as that of the SRAM according to the embodiment 1 of the invention shown in FIG. 14.

A step of forming the resist pattern on aluminum film 44 and steps following the same are the same as those for the SRAM according to the embodiment 1 of the invention. In this manner, the memory cells of the SRAM according to the embodiment 2 of the invention shown in FIG. 17 are completed.

Figure 28:
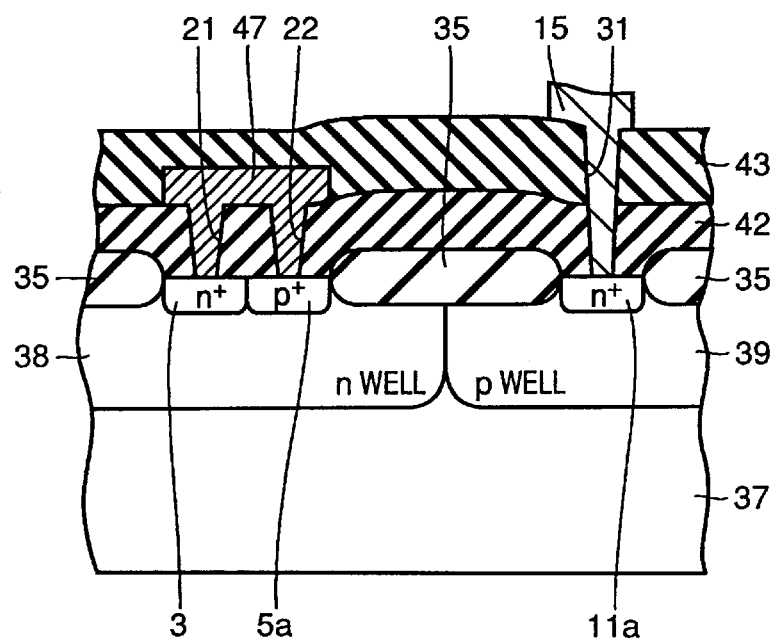
FIG. 28 is a cross section showing a structure taken along line 400—400 in FIG. 27.
Figure 27:
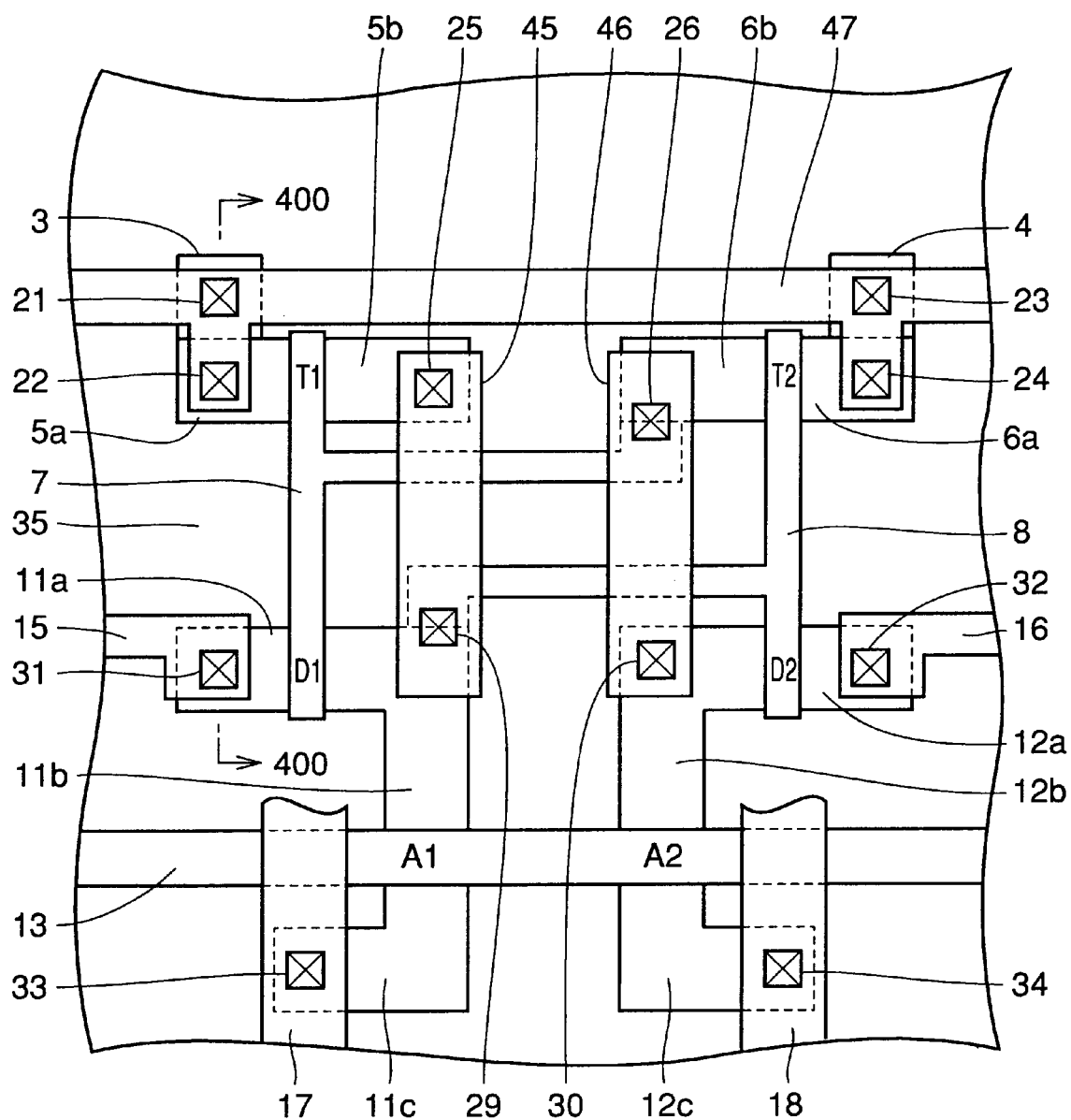
FIG. 27 is a layout plan of a modification of the SRAM according to the embodiment 2 of the invention shown in FIG. 17.
Figure 29:
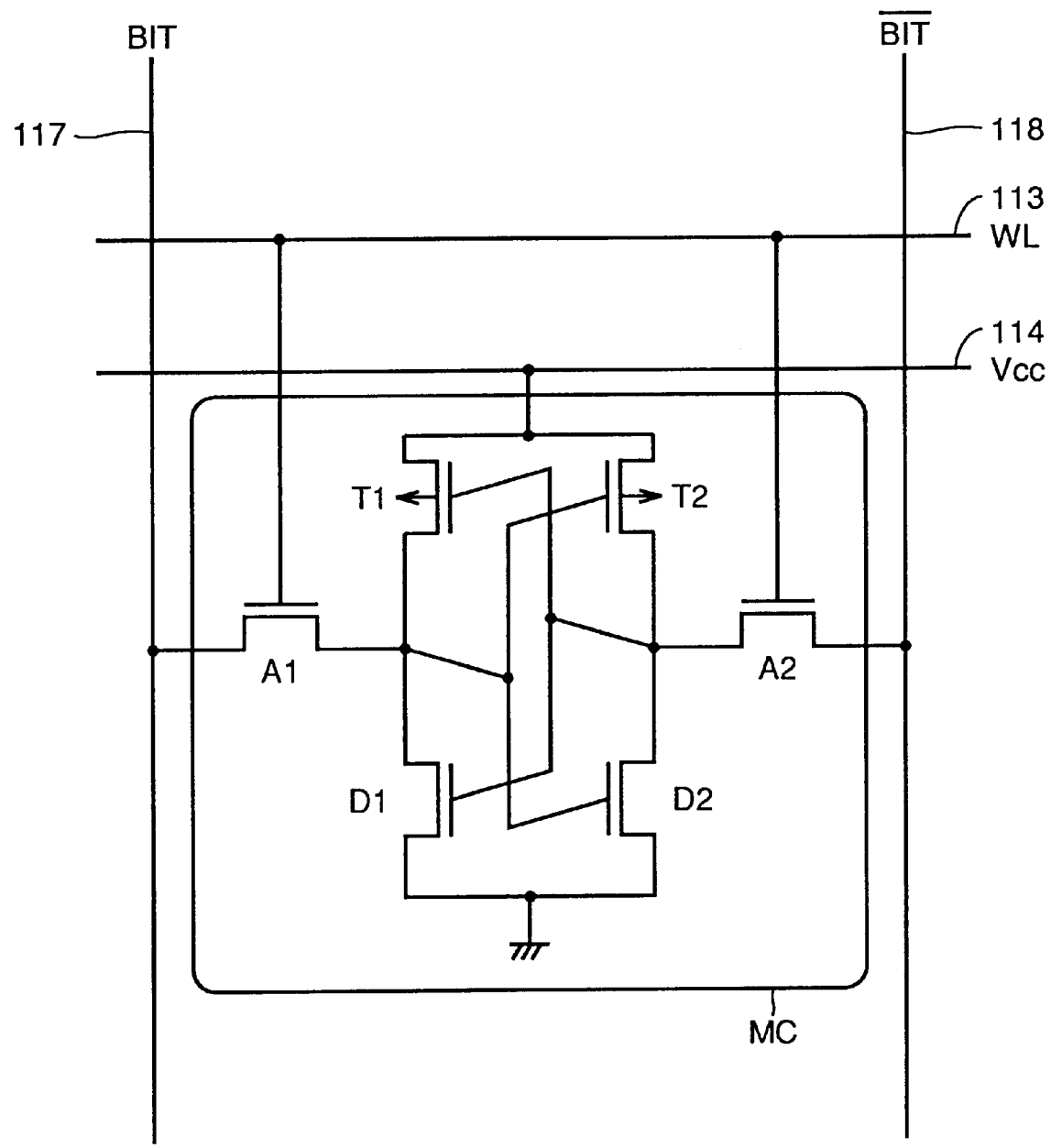
FIG. 29 is an equivalent circuit diagram showing a memory cell of an SRAM in the prior art.
Figure 30:
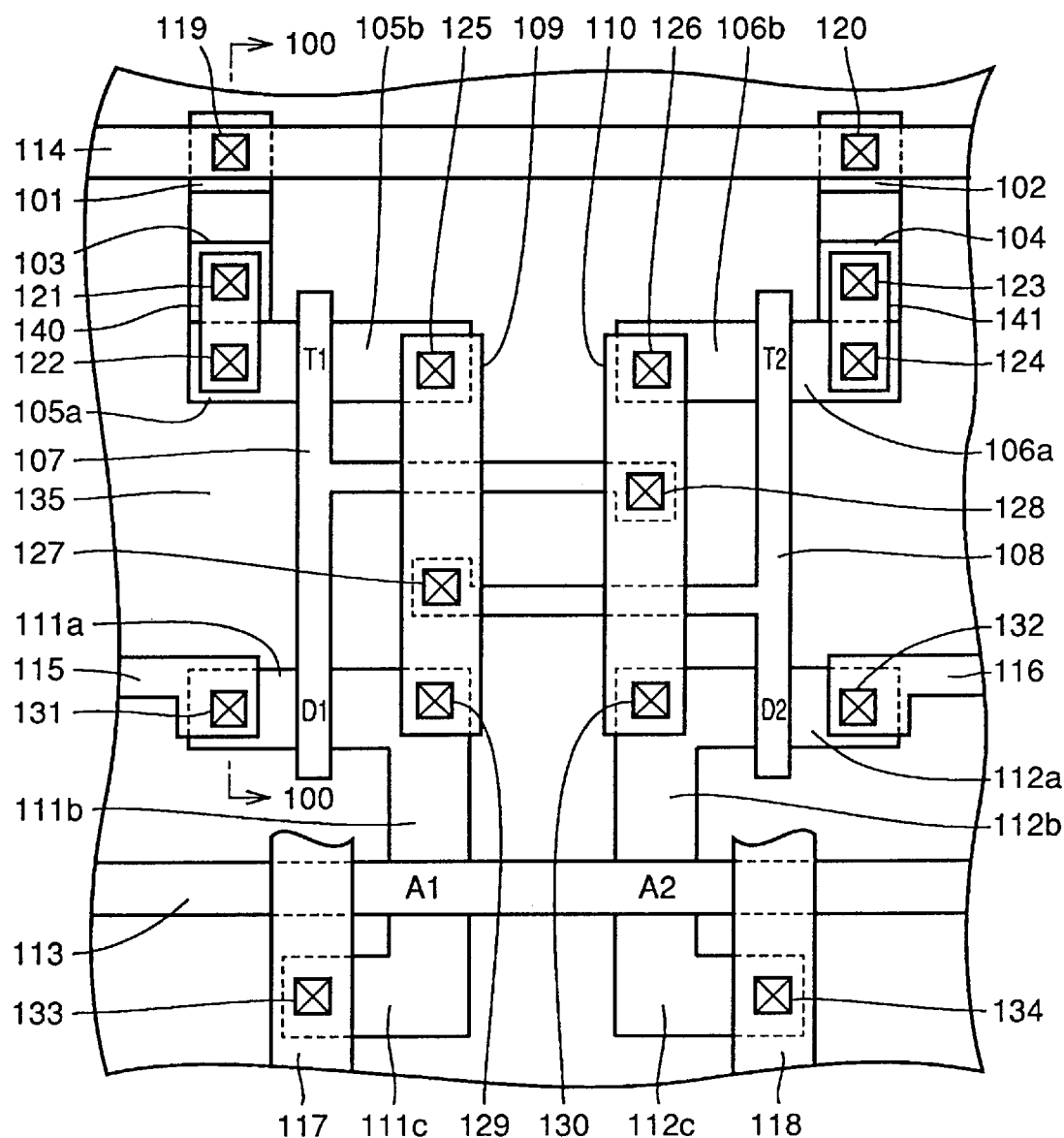
FIG. 30 is a layout plan showing the memory cell of the SRAM in the prior art.
Figure 31:
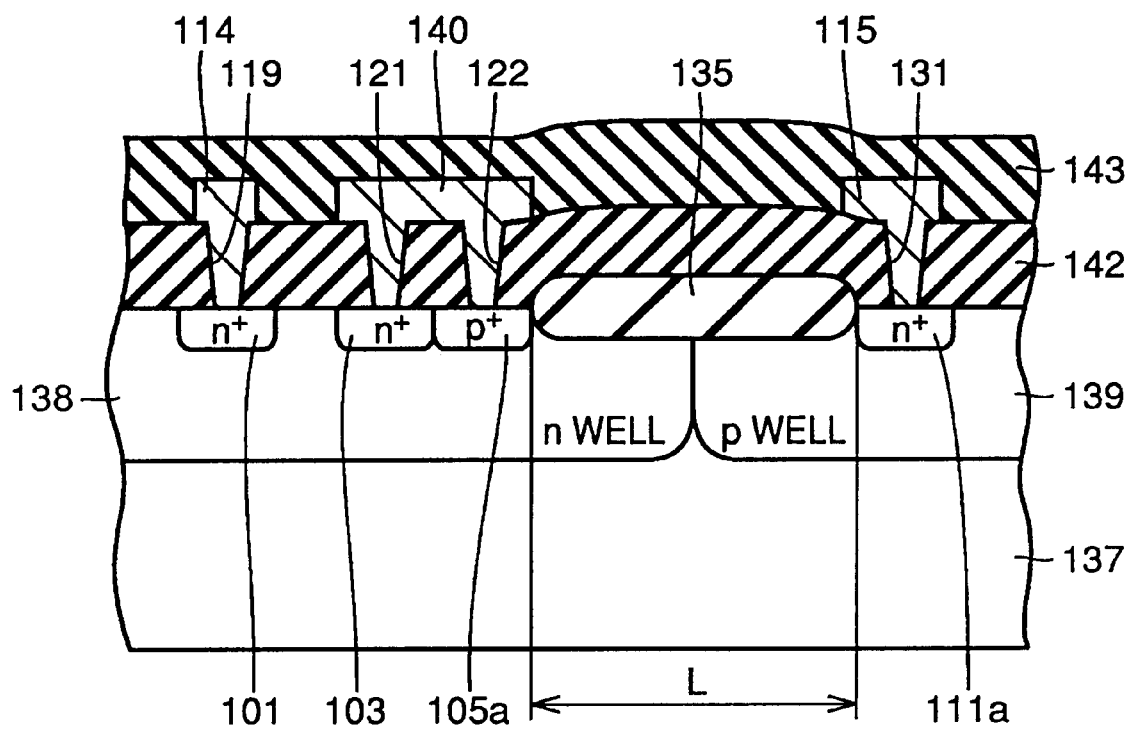
FIG. 31 is a cross section showing a structure taken along line 100—100 in FIG. 30.
Figure 32:
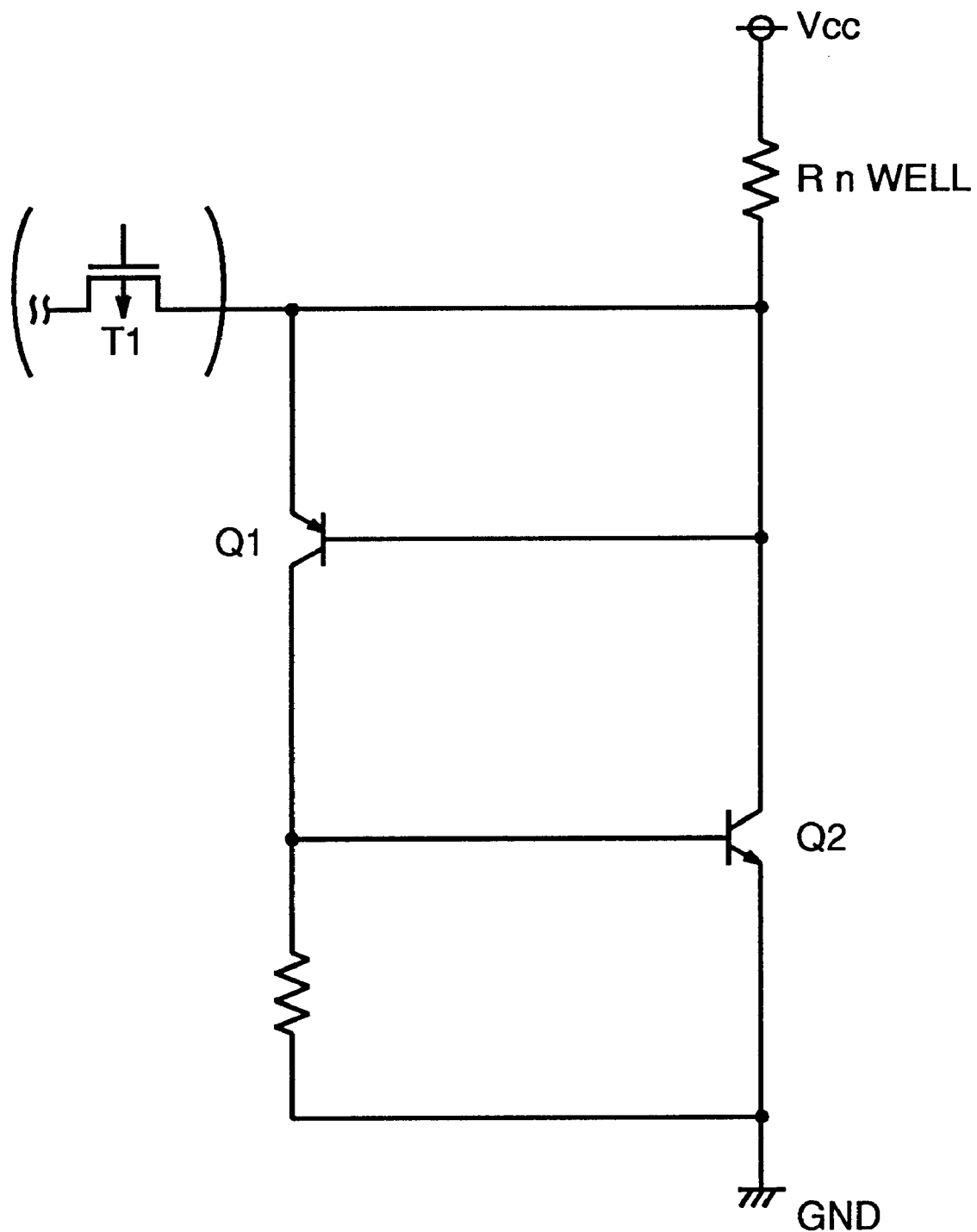
FIG. 32 is an equivalent circuit diagram of a thyristor parasitically formed in the memory cell of the conventional SRAM shown in FIG. 31.

Referring to FIG. 27, a modification of the memory cell of the SRAM according to the embodiment 2 of the invention basically has the same structure as the memory cell of the SRAM according to the embodiment 2 shown in FIG. 17. In this modification, however, power supply line 47 serves also as the power supply interconnection. More specifically, as shown in FIG. 28, power supply line 47 made of tungsten silicide film has portions which are located in contact holes 21 and 22, and are in contact with n-type impurity diffusion region 3 and source region 5a of load transistor T1, respectively. Likewise, as shown in FIG. 27, power supply line 47 has portions which are located in contact holes 23 and 24, and are in contact with n-type impurity diffusion region 4 and source region 6a of load transistor T2, respectively. According to the modification of the embodiment 2 of the invention, as described above, the power supply interconnection and the power supply line are integral with each other. Therefore, the structure of the memory cell of the SRAM can be simpler than that in the embodiment 2 shown in FIG. 17, wherein power supply line 14 and power supply interconnections 40 and 41 are independent of each other. Therefore, the memory cell of the SRAM can be further subminiaturized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first semiconductor region of a first conductivity type and a second semiconductor region of a second conductivity type formed at a main surface of a semiconductor substrate and neighboring to each other;
    a first impurity region of the first conductivity type formed at the main surface of said first semiconductor region and electrically connected to a power supply line or a ground line;
    a second impurity region of the second conductivity type formed at the main surface of said first semiconductor region;
    a third impurity region of the first conductivity type formed at the main surface of said second semiconductor region and electrically connected to the power supply line or the ground line; and
    a connection portion containing semiconductor and formed in contact with said first and second impurity regions, wherein
    a distance between said second and third impurity regions is 2.0 $\mu$m or less.

2. The semiconductor device according to claim 1, wherein
    said connection portion contains silicide of refractory metal.

3. The semiconductor device according to claim 1, wherein
    said semiconductor device is a static semiconductor memory device using a field-effect transistor as a load element.

4. The semiconductor device according to claim 1, wherein
    said connection portion is utilized as a portion of an interconnection.

5. The semiconductor device according to claim 1, wherein
    said connection portion is utilized as a portion of the power supply line.

6. The semiconductor device according to claim 1, further comprising:
    an internal interconnection made of the substantially same material as said connection portion.

7. The semiconductor device according to claim 1, further comprising:
    an interlayer insulating film provided with a contact hole;
    a plurality of conductor portions partially exposed in said contact hole; and
    an interconnection made of the substantially same material as said connection portion, wherein
    said interconnection has a portion located in said contact hole and electrically connected to said plurality of conductor portions.

8. The semiconductor device according to claim 1, further comprising:
    field-effect transistors of a complementary type;
    first and second bipolar transistors parasitically formed, and parasitically forming a thyristor; and
    a rectifier element electrically connected to an emitter electrode of said first bipolar transistor and a power supply portion, wherein
    said first bipolar transistor has a base electrode electrically connected to said power supply portion.

9. A semiconductor device comprising:
    a first semiconductor region of a first conductivity type and a second semiconductor region of a second conductivity type formed at a main surface of a semiconductor substrate and neighboring to each other;
    a first impurity region of the first conductivity type formed at the main surface of said first semiconductor region and electrically connected to a power supply line or a ground line;
    a second impurity region of the second conductivity type formed at the main surface of said first semiconductor region;
    a third impurity region of the first conductivity type formed at the main surface of said second semiconductor region and electrically connected to the power supply line or the ground line; and
    a connection portion containing semiconductor and formed in contact with said first and second impurity regions, wherein
    an isolating oxide film having a width of 2.0 $\mu$m or less is formed at the surface of said semiconductor substrate between said second and third impurity regions.

10. A semiconductor device comprising:
    field-effect transistors of a complementary type;
    first and second bipolar transistors parasitically formed, and parasitically forming a thyristor; and
    a rectifier element electrically connected to an emitter electrode of said first bipolar transistor and a power supply portion, wherein
        said first bipolar transistor has a base electrode electrically connected to said power supply portion, wherein
            a reverse resistance R1 of said rectifier element and an ON resistance R2 of a p-type field-effect transistor forming said field-effect transistor of the complementary type satisfy a relationship of:

$R2/100 < R1 < 100 \times R2$.

11. The semiconductor device according to claim 10, wherein
    said semiconductor device is a static semiconductor memory device using a field-effect transistor as a load element.

12. The semiconductor device according to claim 11, wherein
    said static semiconductor memory device includes a plurality of memory cells each including at least one rectifier element.

13. The semiconductor device according to claim 11, wherein
    said rectifier element of one in number is provided for the two or more memory cells in said static semiconductor memory device.

* * * * *

UNITED STATES PATENT AND TRADEMARK OFFICE
CERTIFICATE OF CORRECTION

PATENT NO. : 6,150,685
DATED : November 21, 2000
INVENTOR(S) : Motoi Ashida, et al.

It is certified that error appears in the above-identified patent and that said Letters Patent is hereby corrected as shown below:

Title page,
Under item [54], line 2 of the title, change the word "FILED" to -- FIELD --.

Column 1,
Line 2 of the title, change the word "FILED" to -- FIELD --.

Signed and Sealed this

Twenty-third Day of October, 2001

Attest:

NICHOLAS P. GODICI
Attesting Officer
Acting Director of the United States Patent and Trademark Office